(12) United States Patent
Nishimura et al.

(10) Patent No.: US 12,550,527 B2
(45) Date of Patent: Feb. 10, 2026

(54) ELECTRONIC DEVICE HAVING APERTURES OF SECOND ELECTRODE NOT OVERLAPPING WITH FIRST ELECTRODE OF PIXELS AND MANUFACTURING METHOD FOR ELECTRONIC DEVICE

(71) Applicant: Dai Nippon Printing Co., Ltd., Tokyo (JP)

(72) Inventors: Naoki Nishimura, Tokyo (JP); Yoko Nakamura, Tokyo (JP); Ryuji Horiguchi, Tokyo (JP); Hiroshi Yano, Tokyo (JP); Yusuke Nakamura, Tokyo (JP); Isao Miyatani, Tokyo (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 311 days.

(21) Appl. No.: 18/168,067

(22) Filed: Feb. 13, 2023

(65) Prior Publication Data

US 2023/0276656 A1    Aug. 31, 2023

(30) Foreign Application Priority Data

Feb. 25, 2022    (JP) .................. 2022-028660

(51) Int. Cl.
*H10K 59/12*    (2023.01)
*H10K 59/30*    (2023.01)
(Continued)

(52) U.S. Cl.
CPC ......... *H10K 59/1201* (2023.02); *H10K 59/30* (2023.02); *H10K 71/00* (2023.02); *H10K 2102/302* (2023.02); *H10K 2102/351* (2023.02)

(58) Field of Classification Search
CPC ..... H10K 59/1201; H10K 59/30; H10K 71/00
See application file for complete search history.

(56) References Cited

U.S. PATENT DOCUMENTS

2016/0322594 A1    11/2016 Kakizoe et al.
2020/0357863 A1*   11/2020 Nakamura ........... H10K 59/352
(Continued)

FOREIGN PATENT DOCUMENTS

CN    111009619 A    4/2020
CN    112151590 A    12/2020
(Continued)

OTHER PUBLICATIONS

Extended European Search Report dated Jul. 31, 2023 (Application No. 23157928.5).

(Continued)

*Primary Examiner* — Michael Jung
(74) *Attorney, Agent, or Firm* — BURR PATENT LAW, PLLC

(57) ABSTRACT

An electronic device may include a substrate, a plurality of first electrodes located on a first surface of the substrate, a plurality of organic layers located on top of the first electrodes, and a second electrode, located on top of the organic layers, that spreads so as to overlap the plurality of first electrodes in planar view. The second electrode may include a plurality of unit regions demarcated based on the plurality of first electrodes and a plurality of apertures, located in the unit regions, that do not overlap the first electrodes in planar view. Each unit region includes a unit region center point located in a center of the unit region in planar view. Each aperture includes an aperture center point located in a center of the aperture in planar view. The plurality of apertures may include a plurality of D11 apertures each displaced toward a D11 side with respect to the unit region center point and a plurality of D12 apertures each displaced toward a D12 side with respect to the unit region center point. The D12 side is a side opposite to the D11 side in planar view.

20 Claims, 32 Drawing Sheets

(51) Int. Cl.
    *H10K 71/00*     (2023.01)
    *H10K 102/00*     (2023.01)

(56) References Cited

U.S. PATENT DOCUMENTS

| | | | |
|---|---|---|---|
| 2020/0365664 A1* | 11/2020 | Jeon | H10K 71/00 |
| 2021/0028248 A1* | 1/2021 | Kim | H10K 59/353 |
| 2021/0202621 A1 | 7/2021 | Liang et al. | |
| 2022/0020952 A1 | 1/2022 | Ikenaga et al. | |
| 2022/0199720 A1* | 6/2022 | Kim | H10K 59/124 |
| 2022/0406858 A1* | 12/2022 | Zhao | H10K 71/621 |
| 2023/0078687 A1 | 3/2023 | Mochizuki | |

FOREIGN PATENT DOCUMENTS

| | | |
|---|---|---|
| CN | 113140591 A | 7/2021 |
| JP | H09-115672 A | 5/1997 |
| WO | 2017/072678 A1 | 5/2017 |
| WO | 2019/150327 A1 | 8/2019 |
| WO | 2020/261191 A1 | 12/2020 |
| WO | 2021/235144 A1 | 11/2021 |

OTHER PUBLICATIONS

European Office Action dated Jun. 26, 2024 (Application No. 23157928.5).
Japanese Office Action (with English translation), Japanese Application No. 2022-028660, dated Jan. 6, 2026 (6 pages).

* cited by examiner

ELECTRONIC DEVICE HAVING APERTURES OF SECOND ELECTRODE NOT OVERLAPPING WITH FIRST ELECTRODE OF PIXELS AND MANUFACTURING METHOD FOR ELECTRONIC DEVICE

CROSS REFERENCES TO RELATED APPLICATIONS

The present application contains subject matter related to Japanese Patent Application No. 2022-28660 filed in the Japan Patent Office on Feb. 25, 2022, the entire contents of which are incorporated herein by reference.

BACKGROUND

1. Field

Embodiments of the present disclosure relate to an electronic device and a manufacturing method for the electronic device.

2. Description of the Related Art

It is preferable that a display device that is used in a portable device such as a smartphone or a tablet PC be high in definition. For example, it is preferable that a display device have a pixel density of 400 ppi or higher. In the field of portable devices too, there has been a growing demand for compatibility with ultrahigh definition (UHD). In this case, it is preferable that a display device have a pixel density of, for example, 800 ppi or higher.

Organic EL display devices have attracted attention because of their high responsivity, low power consumption, and high contrast. As a method for forming pixels of an organic EL display device, there has been known a deposition method. In the deposition method, a deposition mask having formed therein through holes arrayed in a desired pattern is used to form pixels and electrodes in desired patterns. For example, first, a substrate with first electrodes formed in a pattern corresponding to that of the pixels is prepared. Then, an organic material is made to adhere onto the first electrodes via through holes of a deposition mask to form luminescent layers on top of the first electrodes. Then, an electrically conducting material is made to adhere onto the luminescent layers via through holes of a deposition mask to form a second electrode on top of the luminescent layers.

Japanese Unexamined Patent Application Publication No. 9-115672 is an example of related art.

SUMMARY

Conceivable forms of a second electrode in an organic EL display device include a first form and a second form. In the first form, the second electrode spreads all over the substrate. In the second form, the second electrode is formed so that the substrate has regions in which the second electrode is not present. The second form makes it easy for light to be transmitted through the organic EL display device in the regions in which the second electrode is not present. Meanwhile, in a case where the regions in which the second electrode is not present has periodicity, diffraction of light may occur.

An electronic device according to an embodiment of the present disclosure may include a substrate having a first surface and a second surface located opposite the first surface, a plurality of first electrodes located on the first surface of the substrate, a plurality of organic layers located on top of the first electrodes, and a second electrode located on top of the organic layers, the second electrode spreading so as to overlap the plurality of first electrodes in planar view. The second electrode may include a plurality of unit regions demarcated based on the plurality of first electrodes and a plurality of apertures located in the unit regions, the apertures not overlapping the first electrodes in planar view. Each unit region includes a unit region center point located in a center of the unit region in planar view. Each aperture includes an aperture center point located in a center of the aperture in planar view. The plurality of apertures may include a plurality of D11 apertures each displaced toward a D11 side with respect to the unit region center point and a plurality of D12 apertures each displaced toward a D12 side with respect to the unit region center point. The D12 side is a side opposite to the D11 side in planar view.

The present disclosure makes it possible to reduce the intensity of diffracted light that is produced when light passes through an organic EL display device.

DESCRIPTION OF THE EMBODIMENTS

Figure 1:
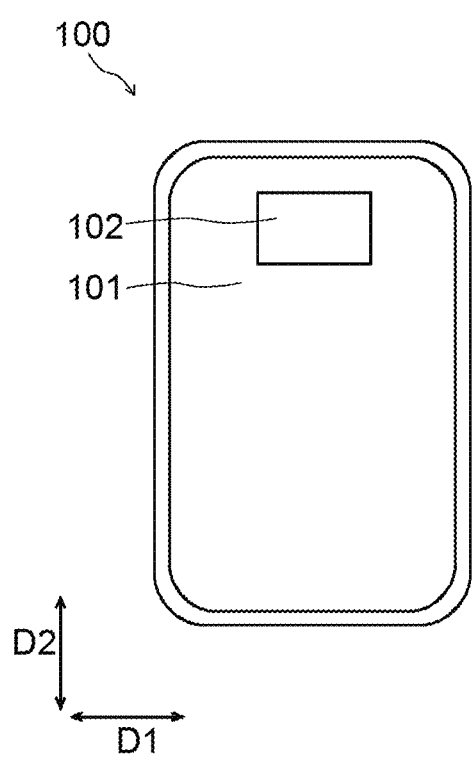
FIG. 1 is a cross-sectional view showing an example of an electronic device according to an embodiment of the present disclosure.

In the present specification and the present drawings, unless otherwise specifically described, terms, such as "substrate" "base material", "plate", "sheet", and "film", that mean a matter forming the basis of a certain component are not distinguished from one another solely on the basis of the difference in designation.

In the present specification and the present drawings, unless otherwise specifically described, shapes and geometric conditions, terms, such as "parallel" and "orthogonal", that specify the extents of the shapes and the geometric conditions, and values, such as lengths and angles, that specify the extents of the shapes and the geometric conditions are not bound by the strict sense but are construed with the inclusion of a range of extents to which similar functions may be expected.

In the present specification and the present drawings, unless otherwise specifically described, cases where a certain component such as a certain member or a certain region is "on top of" or "under", "on the upper side" or "on the lower side", or "above" or "below" another component such as another member or another region encompass cases where a certain component is in direct contact with another component. Furthermore, the cases also encompass cases where a different component is included between a certain component and another component, i.e. cases where a certain component is in indirect contact with another component. Unless otherwise specifically described, the words and phrases such as "on top of", "on the upper side", "above", "under", "on the lower side", and "below" may be turned upside down in meaning.

In the present specification and the present drawings, unless otherwise specifically described, identical components or components having similar functions may be assigned identical or similar signs, and a repeated description of such components may be omitted. For convenience of explanation, dimensional ratios in the drawings may be different from actual ratios, or some components may be omitted from the drawings.

In the present specification and the present drawings, unless otherwise specifically described, an embodiment of the present specification may be combined with another embodiment unless a contradiction arises. Other embodiments may be combined with each other unless a contradiction arises.

In the present specification and the present drawings, unless otherwise specifically described, in a case where multiple steps are disclosed regarding a method such as a manufacturing method, another step that is not disclosed may be executed between steps that are disclosed. The steps that are disclosed may be executed in any order unless a contradiction arises.

In the present specification and the present drawings, unless otherwise specifically described, a range expressed by the preposition "to" includes a numerical value placed before "to" and a numerical value placed after "to". For example, a range defined by the expression "S1 to S3 apertures" is identical to a range defined by the expression "S1 apertures, S2 apertures, and S3 apertures".

An embodiment of the present disclosure is described in detail below with reference to the drawings. It should be noted that the embodiment to be described below is one example among embodiments of the present disclosure, and the present disclosure should not be construed only within the limits of these embodiments.

A first aspect of the present disclosure is directed to an electronic device including:
  a substrate having a first surface and a second surface located opposite the first surface;
  a plurality of first electrodes located on the first surface of the substrate;
  a plurality of organic layers located on top of the first electrodes; and
  a second electrode located on top of the organic layers, the second electrode spreading so as to overlap the plurality of first electrodes in planar view,
  wherein
  the second electrode includes a plurality of unit regions demarcated based on the plurality of first electrodes and a plurality of apertures located in the unit regions, the apertures not overlapping the first electrodes in planar view,
  each unit region includes a unit region center point located in a center of the unit region in planar view,
  each aperture includes an aperture center point located in a center of the aperture in planar view,
  the plurality of apertures includes a plurality of D11 apertures each displaced toward a D11 side with respect to the unit region center point and a plurality of D12 apertures each displaced toward a D12 side with respect to the unit region center point, and
  the D12 side is a side opposite to the D11 side in planar view.

A second aspect of the present disclosure is directed to the electronic device according to the first aspect, wherein the plurality of apertures may include a plurality of D21 apertures each displaced toward a D21 side with respect to the unit region center point and a plurality of D22 apertures each displaced toward a D22 side with respect to the unit region center point. The D21 side is along a second direction orthogonal to a first direction along the D11 side and the D12 side, and the D22 is a side opposite to the D21 side in planar view.

A third aspect of the present disclosure is directed to the electronic device according to the first aspect, wherein the plurality of apertures may include
  a plurality of P1 apertures falling under a category of the D11 apertures but not falling under a category of the D21 apertures or the D22 apertures,
  a plurality of P2 apertures falling under the category of the D11 apertures and falling under the category of the D21 apertures,
  a plurality of P3 apertures falling under the category of the D21 apertures but not falling under the category of the D11 apertures or the D12 apertures,
  a plurality of P4 apertures falling under the category of the D21 apertures and falling under the category of the D12 apertures,
  a plurality of P5 apertures falling under the category of the D12 apertures but not falling under the category of the D21 apertures or the D22 apertures,
  a plurality of P6 apertures falling under the category of the D12 apertures and falling under the category of the D22 apertures,
  a plurality of P7 apertures falling under the category of the D22 apertures but not falling under the category of the D11 apertures or the D12 apertures,
  a plurality of P8 apertures falling under the category of the D22 apertures and falling under the category of the D11 apertures, and
  a plurality of P9 apertures not falling under the category of the D11 apertures, the D12 apertures, the D21 apertures, or the D22 apertures.

A fourth aspect of the present disclosure is directed to the electronic device according to the third aspect, wherein a ratio of a maximum P ratio to a minimum P ratio may be lower than or equal to 3.00. The minimum P ratio is a number of apertures that are smallest in number of the P1 to P9 apertures, and the maximum P ratio is a number of apertures that are largest in number of the P1 to P9 apertures.

A fifth aspect of the present disclosure is directed to the electronic device according to each of the first to fourth aspects, wherein the plurality of apertures may include a plurality of S1 apertures, a plurality of S2 apertures, and a plurality of S3 apertures. A dimension of each of the S2 apertures in planar view is larger than a dimension of each of the S1 apertures in planar view, and a dimension of each of the S3 apertures in planar view is smaller than the dimension of each of the S1 apertures in planar view.

A sixth aspect of the present disclosure is directed to the electronic device according to the fifth aspect, wherein the plurality of apertures may include
  a plurality of D11S1 apertures falling under a category of the D11 apertures and falling under a category of the S1 apertures,
  a plurality of D11S2 apertures falling under the category of the D11 apertures and falling under a category of the S2 apertures,
  a plurality of D11S3 apertures falling under the category of the D11 apertures and falling under a category of the S3 apertures,
  a plurality of D12S1 apertures falling under a category of the D12 apertures and falling under the category of the S1 apertures,
  a plurality of D12S2 apertures falling under the category of the D12 apertures and falling under the category of the S2 apertures, and
  a plurality of D12S3 apertures falling under the category of the D12 apertures and falling under the category of the S3 apertures.

A seventh aspect of the present disclosure is directed to an electronic device including:
  a substrate having a first surface and a second surface located opposite the first surface;
  a plurality of first electrodes located on the first surface of the substrate;

a plurality of organic layers located on top of the first electrodes; and a second electrode located on top of the organic layers, the second electrode spreading so as to overlap two or more of first electrodes in planar view, wherein the second electrode includes a plurality of unit regions demarcated based on the plurality of first electrodes and a plurality of apertures located in the unit regions, the apertures not overlapping the first electrodes in planar view, the plurality of apertures includes a plurality of apertures, a plurality of apertures, and a plurality of apertures, a dimension of each of the S2 apertures in planar view is larger than a dimension of each of the S1 apertures in planar view, and a dimension of each of the S3 apertures in planar view is smaller than the dimension of each of the S1 apertures in planar view.

An eighth aspect of the present disclosure is directed to the electronic device according to each of the fifth to seventh aspects, wherein a ratio of a maximum S ratio to a minimum S ratio may be lower than or equal to 10. The minimum S ratio is a number of apertures that are smallest in number of the S1 to S3 apertures, and the maximum S ratio is a number of apertures that are largest in number of the S1 to S3 apertures.

A ninth aspect of the present disclosure is directed to the electronic device according to each of the first to eighth aspects, wherein each of the unit regions may be demarcated by a quadrangle that is obtained by connecting center points of four of the first electrodes.

A tenth aspect of the present disclosure is directed to the electronic device according to the ninth aspect, wherein the plurality of organic layers may include a plurality of first organic layers, a plurality of second organic layers, and a plurality of third organic layers. The plurality of first electrodes may include a plurality of A1 electrodes overlapping the first organic layers, a plurality of A2 electrodes overlapping the second organic layers, and a plurality of A3 electrodes overlapping the third organic layers. The four of the first electrodes corresponding to the quadrangle may include at least one of the A1 electrodes, at least one of the A2 electrodes, and at least one of the A3 electrodes.

An eleventh aspect of the present disclosure is directed to the electronic device according to the tenth aspect, wherein the first organic layers may be red luminescent layers, the second organic layers may be blue luminescent layers, and the third organic layers may be green luminescent layers. The four of the first electrodes corresponding to the quadrangle may include one of the A1 electrodes, one of the A2 electrodes, and two of the A3 electrodes.

A twelfth aspect of the present disclosure is directed to the electronic device according to each of the first to eleventh aspects, wherein the apertures may be surrounded by the second electrode in planar view.

A thirteenth aspect of the present disclosure is directed to the electronic device according to each of the first to twelfth aspects, wherein the organic layers may include organic layer apertures overlapping the apertures in planar view.

A fourteenth aspect of the present disclosure is directed to the electronic device according to the thirteenth aspect, wherein the organic layer apertures may overlap parts of the second electrode in planar view.

A fifteenth aspect of the present disclosure is directed to the electronic device according to each of the first to fourteenth aspects, wherein the electronic device may further include an insulating layer including insulating layer first apertures overlapping the first electrodes in planar view, the insulating layer being located between the first surface of the substrate and the organic layers in a direction normal to the first surface.

A sixteenth aspect of the present disclosure is directed to the electronic device according to the fifteenth aspect, wherein the insulating layer may include insulating layer second apertures located between the first electrodes in planar view, the insulating layer second apertures overlapping the apertures.

A seventeenth aspect of the present disclosure is directed to a manufacturing method for an electronic device, the manufacturing method including:

a preparing step of preparing a layered product including a substrate having a first surface and a second surface located opposite the first surface, a plurality of first electrodes located on the first surface of the substrate, and a plurality of organic layers located on top of the first electrodes; and a second electrode forming step of forming a second electrode on top of the organic layers so that the second electrode overlaps the plurality of first electrodes in planar view, wherein the second electrode includes a plurality of unit regions demarcated based on the plurality of first electrodes and a plurality of apertures located in the unit regions, the apertures not overlapping the first electrodes in planar view, each unit region includes a unit region center point located in a center of the unit region in planar view, each aperture includes an aperture center point located in a center of the aperture in planar view, the plurality of apertures includes a plurality of D11 apertures each displaced toward a D11 side with respect to the unit region center point and a plurality of D12 apertures each displaced toward a D12 side with respect to the unit region center point, and the D12 side is a side opposite to the D11 side in planar view.

An eighteenth aspect of the present disclosure is directed to a manufacturing method for an electronic device, the manufacturing method including:

a preparing step of preparing a layered product including a substrate having a first surface and a second surface located opposite the first surface, a plurality of first electrodes located on the first surface of the substrate, and a plurality of organic layers located on top of the first electrodes; and a second electrode forming step of forming a second electrode on top of the organic layers so that the second electrode overlaps the plurality of first electrodes in planar view, wherein the second electrode includes a plurality of unit regions demarcated based on the plurality of first electrodes and a plurality of apertures located in the unit regions, the apertures not overlapping the first electrodes in planar view, the plurality of apertures includes a plurality of apertures, a plurality of apertures, and a plurality of apertures, a dimension of each of the S2 apertures in planar view is larger than a dimension of each of the S1 apertures in planar view, and a dimension of each of the S3 apertures in planar view is smaller than the dimension of each of the S1 apertures in planar view.

A nineteenth aspect of the present disclosure is directed to the manufacturing method according to the seventeenth or eighteenth aspect, wherein the manufacturing method may further include a removing step of removing parts of the unit regions and thereby forming the apertures.

A twentieth aspect of the present disclosure is directed to the manufacturing method according to the nineteenth aspect, wherein the removing step may include an irradiating step of irradiating the second electrode with a laser and thereby forming the apertures.

An embodiment of the present disclosure is described in detail below with reference to the drawings. It should be noted that the embodiment to be described below is one example among embodiments of the present disclosure, and the present disclosure should not be construed only within the limits of these embodiments.

FIG. 1 is a plan view showing an example of an electronic device 10. The electronic device 10 is for example a smartphone. The electronic device 10 may have outer edges including sides extending in a first direction D1 and sides extending in a second direction D2.

The electronic device 10 may include a first display area 101 and a second display area 102. The second display area 102 may have a smaller area than the first display area 101. As shown in FIG. 1, the second display area 102 may be surrounded by the first display area 101. Although not illustrated, the second display area 102 may have its outer edges partially located in the same straight line as parts of the outer edges of the first display area 101.

Figure 2:
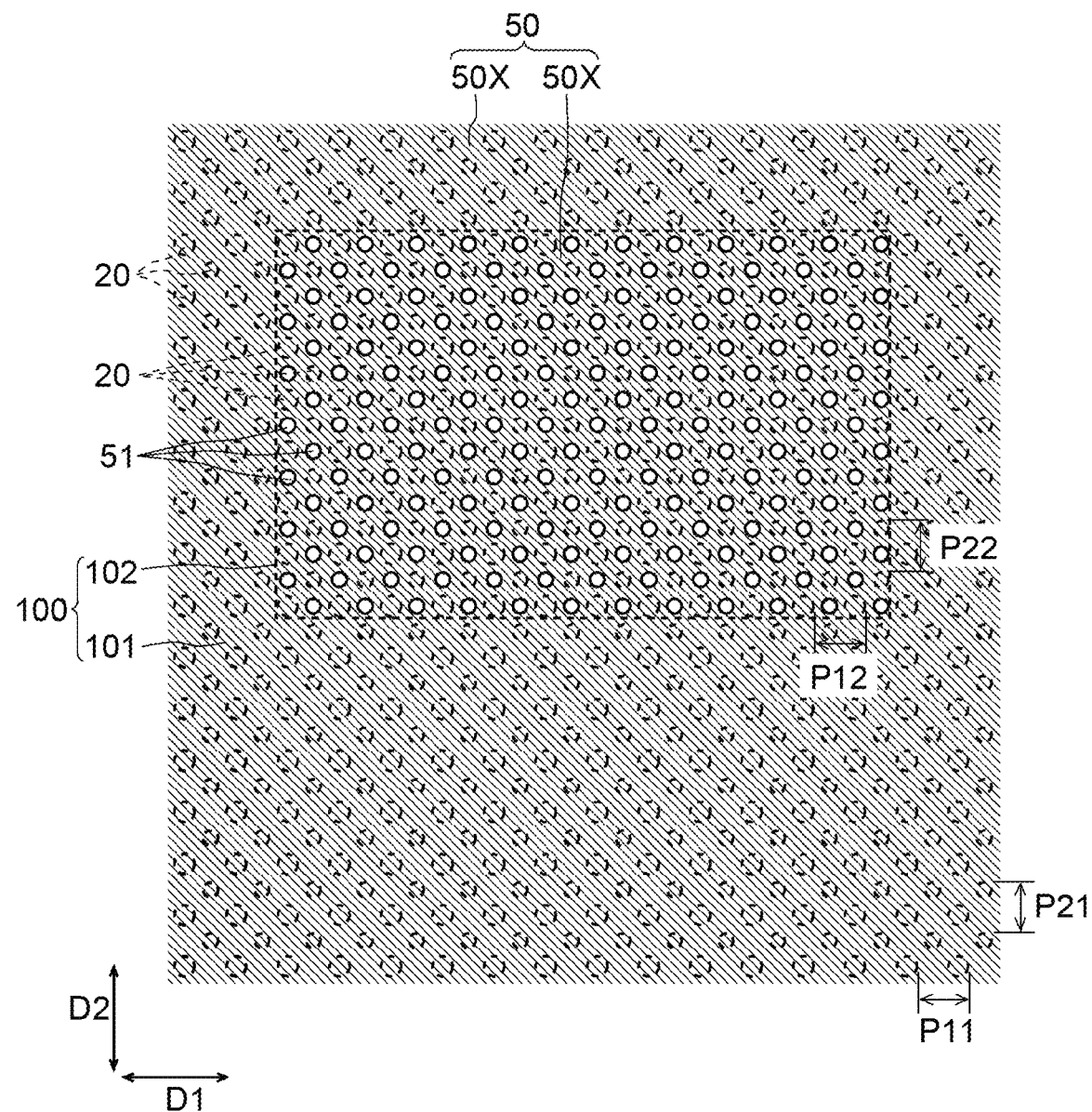
FIG. 2 is a plan view showing examples of a first display area and a second display area.

FIG. 2 is an enlarged plan view showing the second display area 102 of FIG. 1 and an area around the second display area 102. In the first display area 101 and the second display area 102, elements 20 may be arranged along two different directions. For example, the first display area 101 may include a plurality of elements 20 arranged at eleventh pitches P11 along a first direction D1 and arranged at twenty-first pitches P21 along a second direction D2. For example, the first display area 101 may include a plurality of elements 20 arranged at twelfth pitches P12 along the first direction D1 and arranged at twenty-second pitches P22 along the second direction D2. The twelfth pitches P12 may be equal to the eleventh pitches P11. The twenty-first pitches P21 may be equal to the twenty-second pitches P22.

The elements 20 are for example pixels. In a case where the elements 20 are pixels, pictures are displayed in the first display area 101 and the second display area 102.

The dimensions of an element 20 located in the second display area 102 may be smaller than the dimensions of an element 20 located in the first display area 101. For example, the dimensions of the after-mentioned first electrode of an element 20 of the second display area 102 may be smaller than the dimensions of the first electrode of an element 20 of the first display area 101.

The elements 20 include a second electrode 50. Part of the second electrode 50 located in the first display area 101 is also referred to as "second electrode 50X". Part of the second electrode 50 located in the second display area 102 is also referred to as "second electrode 50Y".

Figure 38:
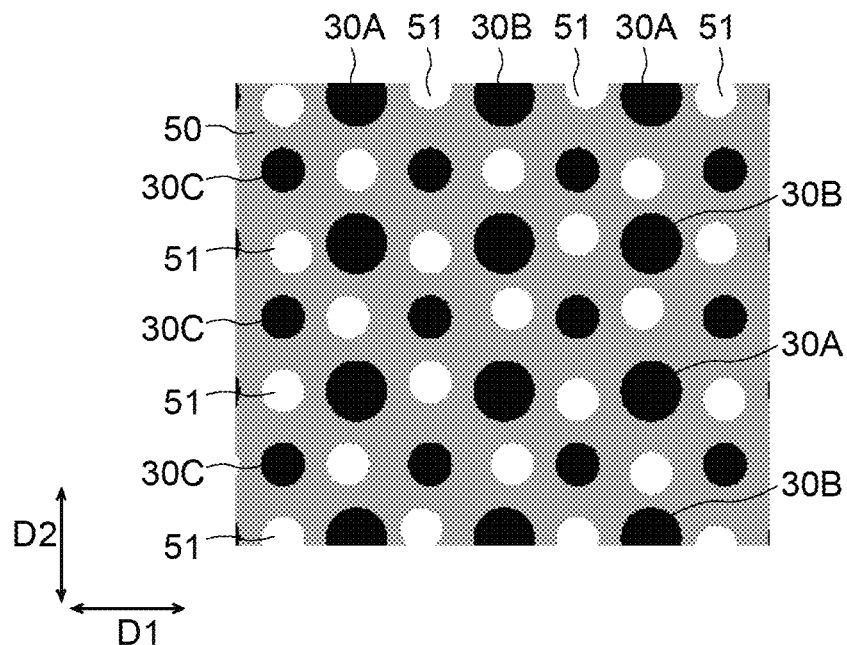
FIG. 38 is a plan view showing an example of an arrangement of apertures of a second electrode in Example 2.

The second electrode 50X has a first occupancy rate. The first occupancy rate is calculated by dividing the total area of the part of the second electrode 50 located in the first display area 101 by the area of the first display area 101. The second electrode 50Y has a second occupancy rate. The second occupancy rate is calculated by dividing the total area of the part of the second electrode 50 located in the second display area 102 by the area of the second display area 102. The second occupancy rate may be lower than the first occupancy rate. For example, as shown in FIG. 38, the second electrode 50Y may include apertures 51.

The ratio of the second occupancy rate to the first occupancy rate may for example be higher than or equal to 0.2, higher than or equal to 0.3, or higher than or equal to 0.4. The ratio of the second occupancy rate to the first occupancy rate may for example be lower than or equal to 0.6, lower than or equal to 0.7, or lower than or equal to 0.8. The ratio of the second occupancy rate to the first occupancy rate may fall within a range defined by a first group consisting of 0.2, 0.3, and 0.4 and/or a second group consisting of 0.6, 0.7, and 0.8. The ratio of the second occupancy rate to the first occupancy rate may fall within a range defined by a combination of any one of the values included in the aforementioned first group and any one of the values included in the aforementioned second group. The ratio of the second occupancy rate to the first occupancy rate may fall within a range defined by a combination of any two of the values included in the aforementioned first group. The ratio of the second occupancy rate to the first occupancy rate may fall within a range defined by a combination of any two of the values included in the aforementioned second group. The ratio of the second occupancy to the first occupancy may for example be higher than or equal to 0.2 and lower than or equal to 0.8, higher than or equal to 0.2 and lower than or equal to 0.7, higher than or equal to 0.2 and lower than or equal to 0.6, higher than or equal to 0.2 and lower than or equal to 0.4, higher than or equal to 0.2 and lower than or equal to 0.3, higher than or equal to 0.3 and lower than or equal to 0.8, higher than or equal to 0.3 and lower than or equal to 0.7, higher than or equal to 0.3 and lower than or equal to 0.6, higher than or equal to 0.3 and lower than or equal to 0.4, higher than or equal to 0.4 and lower than or equal to 0.8, higher than or equal to 0.4 and lower than or equal to 0.7, higher than or equal to 0.4 and lower than or equal to 0.6, higher than or equal to 0.6 and lower than or equal to 0.8, higher than or equal to 0.6 and lower than or equal to 0.7, or higher than or equal to 0.7 and lower than or equal to 0.8.

In a case where the second occupancy rate is lower than the first occupancy rate, the second display area 102 has a higher transmittance than the first display area 101. In this case, in the second display area 102, light having arrived at the electronic device 10 easily arrives at an optical component or other components situated behind a substrate 15. The optical component is a component, such as a camera, that achieves some sort of function by detecting light. The function of the second display area 102 that is achieved by detecting light is for example a sensor such as a camera, a fingerprint sensor, or a face authentication sensor.

In the present embodiment, elements 20 that can function as pixels are placed in the second display area 102 as well as the first display area 101. For this reason, the second display area 102 can detect light and display a picture.

The part of the second electrode 50 located in the first display area 101 may spread substantially all over the first display area 101. For example, the first occupancy rate may be higher than or equal to 90%, higher than or equal to 95%, higher than or equal to 98%, higher than or equal to 99%, higher than or equal to 99.5%, higher than or equal to 99.9%, or 100%.

Figure 3:
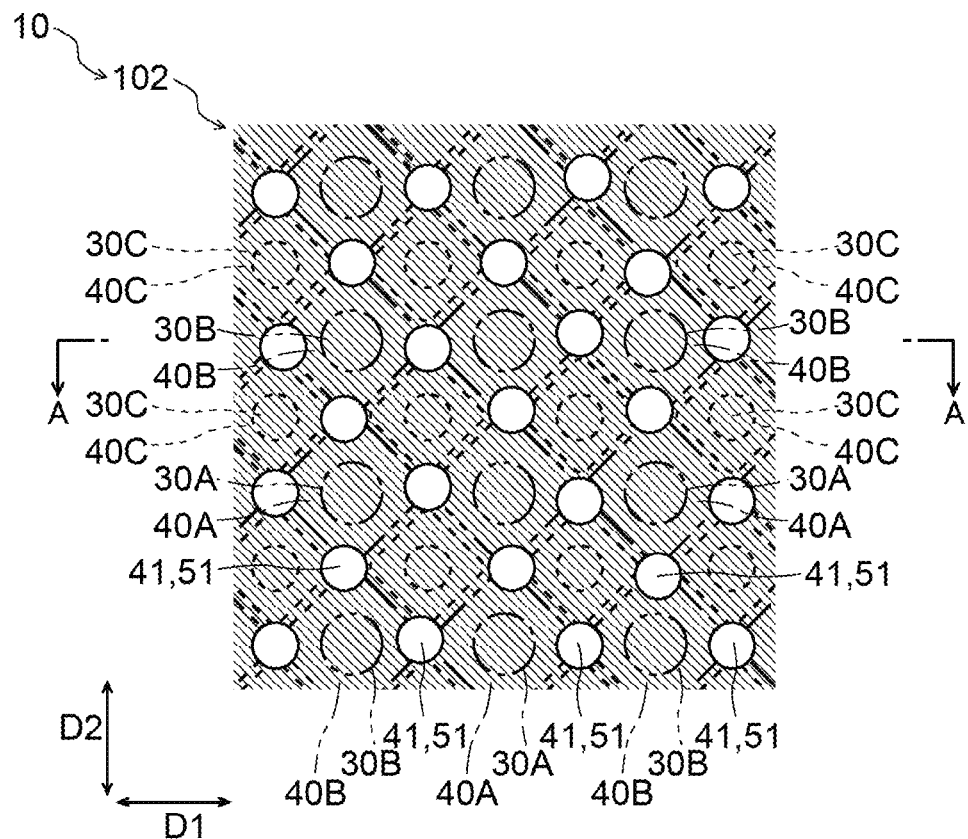
FIG. 3 is a plan view showing an example of the second display area.
Figure 4:
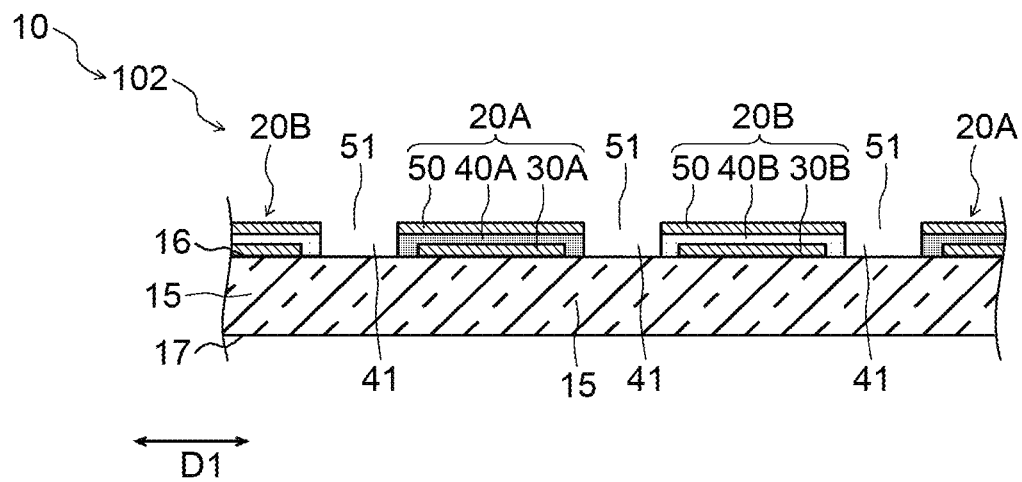
FIG. 4 is a cross-sectional view of the second display area as taken along line A-A in FIG. 3.

FIG. 3 is a plan view showing an example of the second display area 102. FIG. 4 is a cross-sectional view of the second display area 102 as taken along line A-A in FIG. 3.

The electronic device 10 may include a substrate 15, a plurality of first electrodes 30, a plurality of organic layers 40, and a second electrode 50. The substrate 15 includes a first surface 16 and a second surface 17. The second surface 17 is located opposite the first surface 16.

The plurality of first electrodes 30 may be located on the first surface 16. The plurality of organic layers 40 may be located on top of the first electrodes 30. The second electrode 50 may be located on top of the organic layers 40. The second electrode 50 may spread so as to overlap the plurality of first electrodes 30 in planar view. The elements 20 are each constituted by a stack structure including a first electrode 30, an organic layer 40, and the second electrode 50. The elements 20 can each achieve some sort of function through the application of a voltage between the first electrode 30 and the second electrode 50 or the flow of an electric current between the first electrode 30 and the second electrode 50. The term "planar view" means a view of a physical object along a direction normal to the first surface 16.

The elements 20 may be arranged on the first surface 16 along an in-plane direction of the first surface 16. Although not illustrated, in the first display area 101 too, the elements 20 may be arranged on the first surface 16 along the in-plane direction of the first surface 16.

The electronic device 10 may be of an active matrix type. For example, although not illustrated, the electronic device 10 may include switches electrically connected separately to each of the elements 20. The switches are for example transistors. Each of the switches can control the turning on and turning off of a voltage that is applied to or of an electric current that flows through the corresponding one of the elements 20.

As shown in FIGS. 3 and 4, the plurality of organic layer 40 may include a plurality of first organic layers 40A, a plurality of second organic layers 40B, and a plurality of third organic layers 40C. The first organic layers 40A, the second organic layers 40B, and the third organic layers 40C are for example red luminescent layers, blue luminescent layers, and green luminescent layers, respectively. Configurations common to the first organic layers 40A, the second organic layers 40B, and the third organic layers 40C are described with reference to the term and reference sign "organic layers 40".

As shown in FIGS. 3 and 4, the plurality of first electrodes 30 may include a plurality of A1 electrodes 30, a plurality of A2 electrodes 30B, and a plurality of A3 electrodes 30C. The A1 electrodes 30A overlap the first organic layers 40A in planar view. The A2 electrodes 30B overlap the second organic layers 40B in planar view. The A3 electrodes 30C overlap the third organic layers 40C in planar view. Configurations common to the A1 electrodes 30A, the A2 electrodes 30B, and the A3 electrodes 30C are described with reference to the term and reference sign "first electrodes 30".

The plurality of elements 20 may include a plurality of first elements 20A, a plurality of second elements 20B, and a plurality of third elements 20C. The first elements 20A each include an A1 electrode 30A, a first organic layer 40A, and the second electrode 50. The second elements 20B each include an A2 electrode 30B, a second organic layer 40B, and the second electrode 50. The third elements 20C each include an A3 electrode 30C, a third organic layer 40C, and the second electrode 50. Configurations common to the first elements 20A, the second elements 20B, and the third elements 20C are described with reference to the term and reference sign "elements 20".

The substrate 15, the first electrodes 30, the organic layers 40, and the second electrode 50 are described in detail.

The substrate 15 may be a plate member having insulation properties. The substrate 15 preferably has transparency that allows transmission of light. Although not illustrated, there may be a wiring layer located between the substrate 15 and the elements 20. The wiring layer can transmit, for example, electric signals and electric power to the elements 20.

The transmittance of the substrate 15 may for example by higher than or equal to 70% or higher than or equal to 80%. The transmittance of the substrate 15 can be measured in conformity with "Plastics—Determination of the total luminous transmittance of transparent materials" provided for in ES K7361-1.

The substrate 15 may or may not have flexibility. An appropriate substrate 15 can be selected depending on the intended use of the electronic device 10.

The substrate 15 can be made of a material such as either a rigid material such as quartz glass, Pyrex (registered trademark) glass, a synthetic quartz plate, or alkali-free glass or a flexible material such as a resin film, an optical resin plate, or thin glass. Further, the substrate 15 may be a layered product including a resin film and a barrier layer(s) on one or both surfaces of the resin film.

An appropriate thickness of the substrate 15 can be selected depending on the material of which the substrate 15 is made, the intended use of the electronic device 10, or other conditions, but may for example be greater than or equal to 0.005 mm. The thickness of the substrate 15 may be less than or equal to 5 mm.

The first electrodes 30 contain a material having electrical conductivity. For example, the first electrodes 30 contain a metal, a metal oxide having electrical conductivity, an inorganic material having electrical conductivity, or other materials. The first electrodes 30 may contain a metal oxide having transparency and electrical conductivity, such as indium tin oxide.

The organic layers 40 contain an organic material. The passage of electricity through the organic layers 40 allows the organic layers 40 to fulfill some sort of function. The passage of electricity means the application of a voltage to the organic layers 40 or the flow of an electric current through the organic layers 40. Usable examples of the organic layers 40 include luminescent layers that emit light with the passage of electricity and layers whose light transmittances and refractive indices vary with the passage of electricity. The organic layers 40 may contain an organic semiconductor material. The organic layers 40 may further include hole injection layers, hole transport layers, electron transport layers, electron injection layers, or other layers.

The second electrode 50 contains a material having electrical conductivity, such as a metal. Possible examples of materials that constitute the second electrode 50 include platinum, gold, silver, copper, iron, tin, chromium, aluminum, indium, lithium, sodium, potassium, calcium, magnesium, carbon, and alloys thereof.

Next, the apertures 51 are described in detail.

As shown in FIGS. 3 and 4, the apertures 51 are formed in the second electrode 50 so as not to overlap the first electrodes 30 in planar view. The apertures 51 may be surrounded by the second electrode 50 in planar view. Each of the apertures 51 may be located between adjacent two of the first electrodes 30 in planar view. For example, an aperture 51 may be located between two of the first electrodes 30 adjacent to each other in the first direction D1. For example, an aperture 51 may be located between two of the first electrodes 30 adjacent to each other in the second direction D2.

The inclusion of the apertures 51 by the second electrode 50 allows easier transmission of light to through the electronic device 10 than in a case where the second electrode 50 spreads all over the second display area 102. This makes it possible to increase the transmittance of the second display area 102.

As shown in FIGS. 3 and 4, the organic layers 40 may include organic layer apertures 41 overlapping the apertures 51 in planar view. As is the case with the apertures 51, each of the organic layer apertures 41 may be located between two of the first electrodes 30 adjacent to each other in the first direction D1. As is the case with the apertures 51, each of the organic layer apertures 41 may be located between two of the first electrodes 30 adjacent to each other in the second direction D2.

A problem that can arise in a case where the apertures 51 are formed in the second electrode 50 are described. In a case where the apertures 51 are regularly arranged, it is conceivable that rays of light diffracted when passing through the apertures 51 may intensify one another in a particular direction of travel of light. In this case, it is conceivable that the sharpness of an image that is generated by an optical component laid on the second display area 102 may be reduced.

To address such a problem, the present embodiment proposes reducing regularity of an arrangement of the apertures 51. This makes it possible to restrain high-intensity diffracted light from falling on an optical component such as a sensor. This makes it possible, for example, to reduce blurring of an image that is generated by the sensor.

Figure 5:
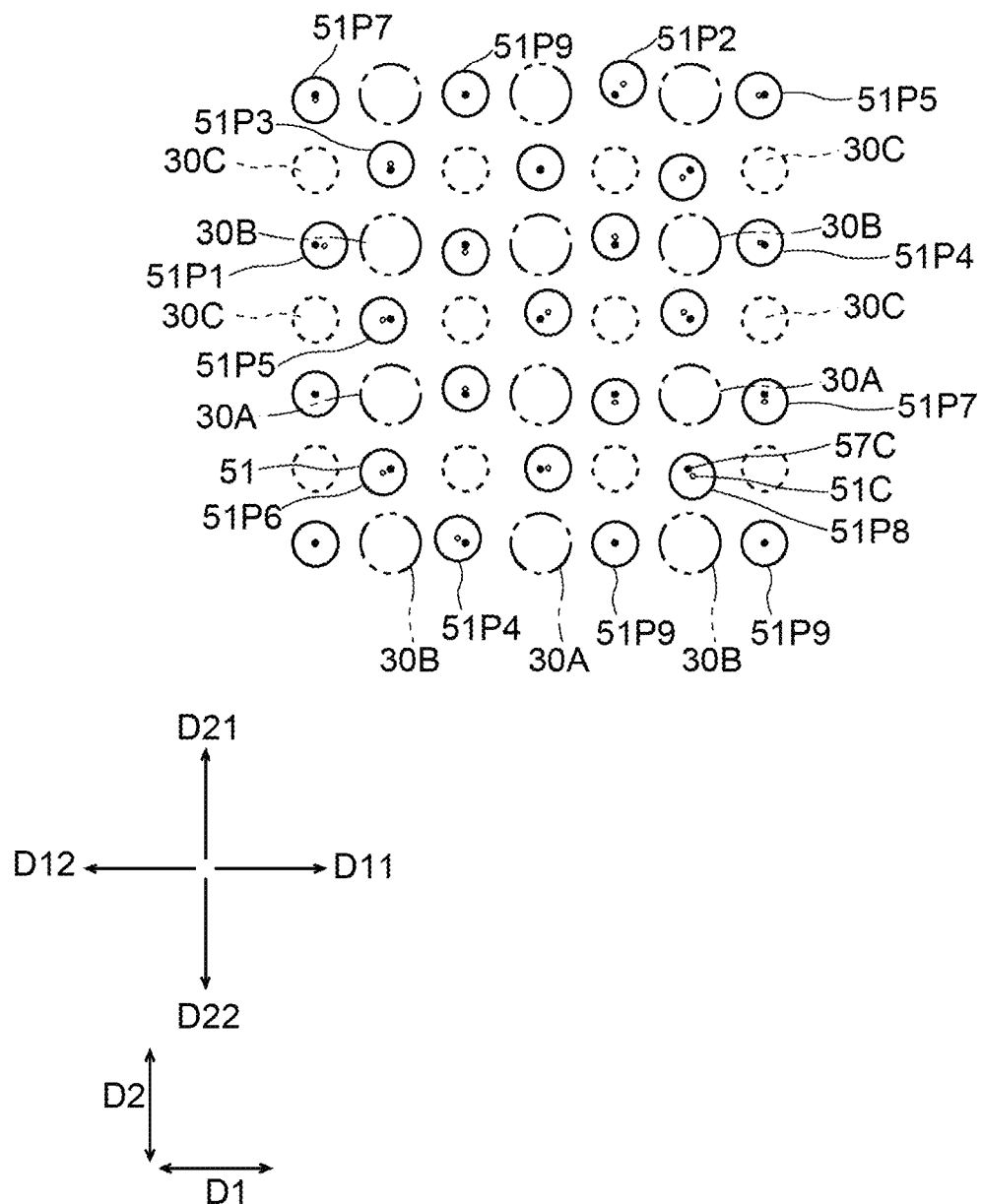
FIG. 5 is a plan view showing an example of an arrangement of apertures of a second electrode.

A specific arrangement of the apertures 51 is described. FIG. 5 is a plan view showing an example of an arrangement of the apertures 51. FIG. 5 is equivalent to a drawing obtained by omitting the organic layers 40 and the second electrode 50 from FIG. 3.

Figure 22:
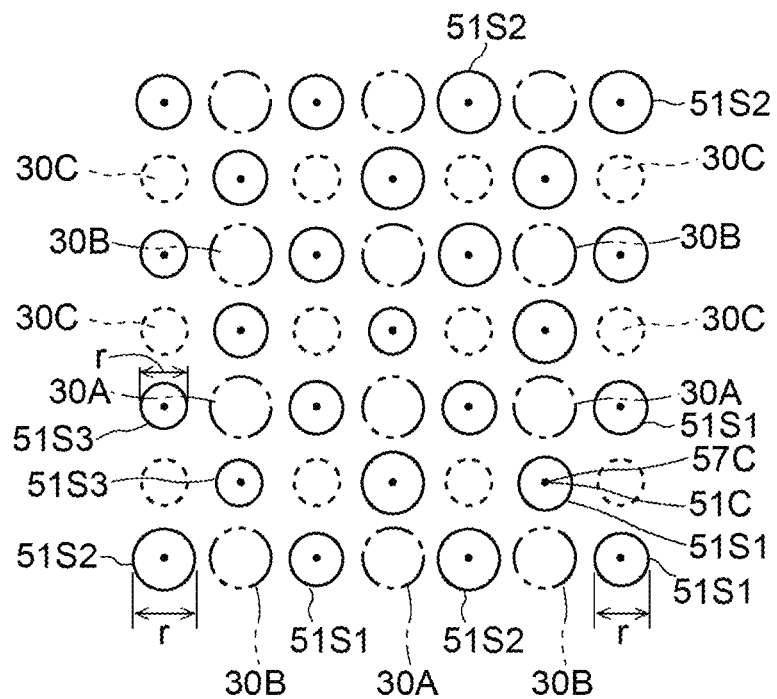
FIG. 22 is a plan view showing an example of an arrangement of the apertures of the second electrode.
Figure 22:
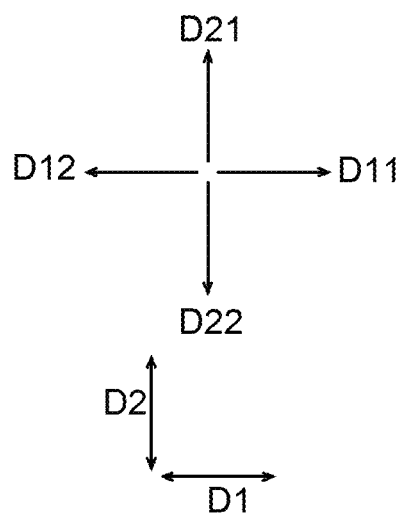
Figure 23:
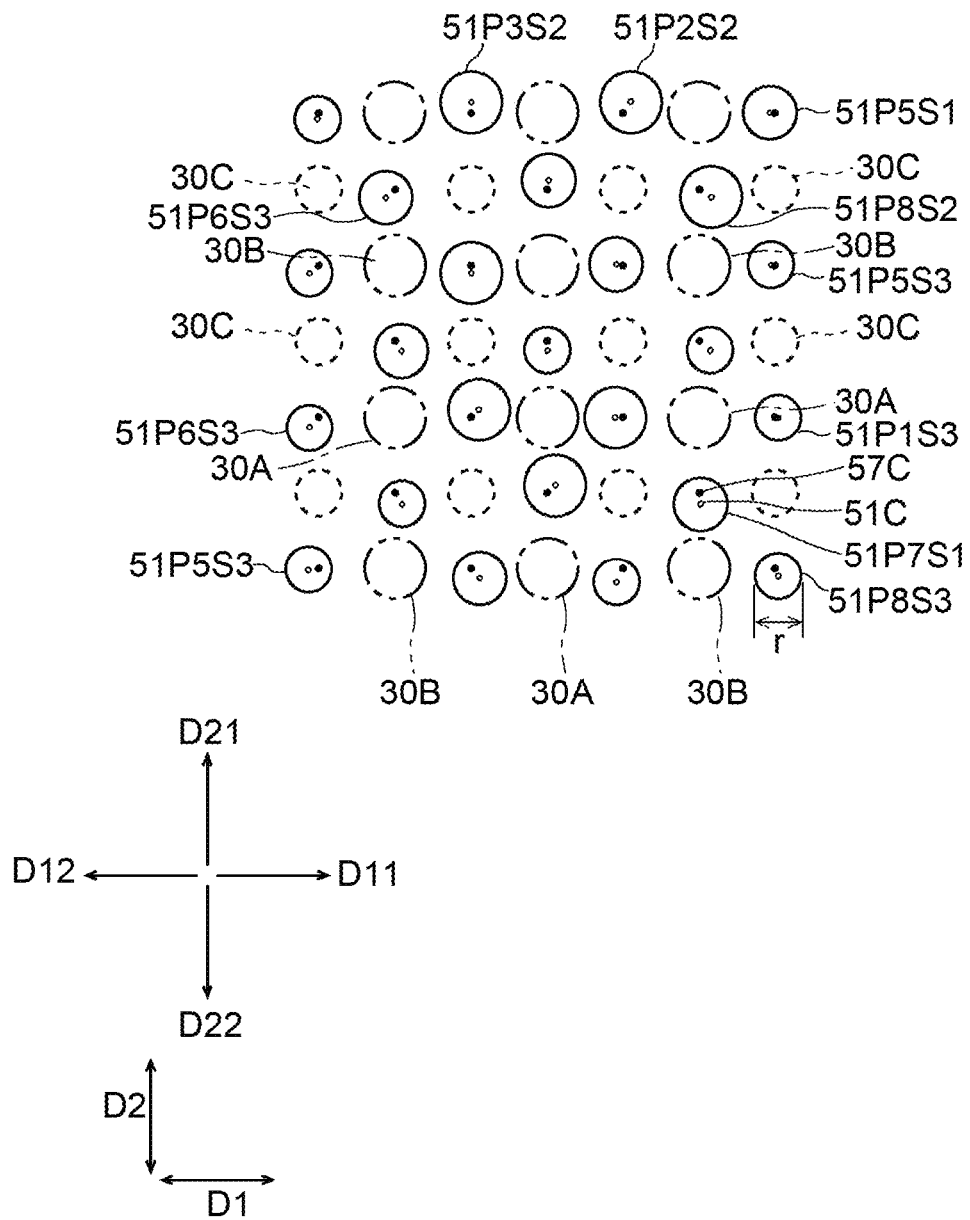
FIG. 23 is a plan view showing an example of an arrangement of the apertures of the second electrode.
Figure 24:
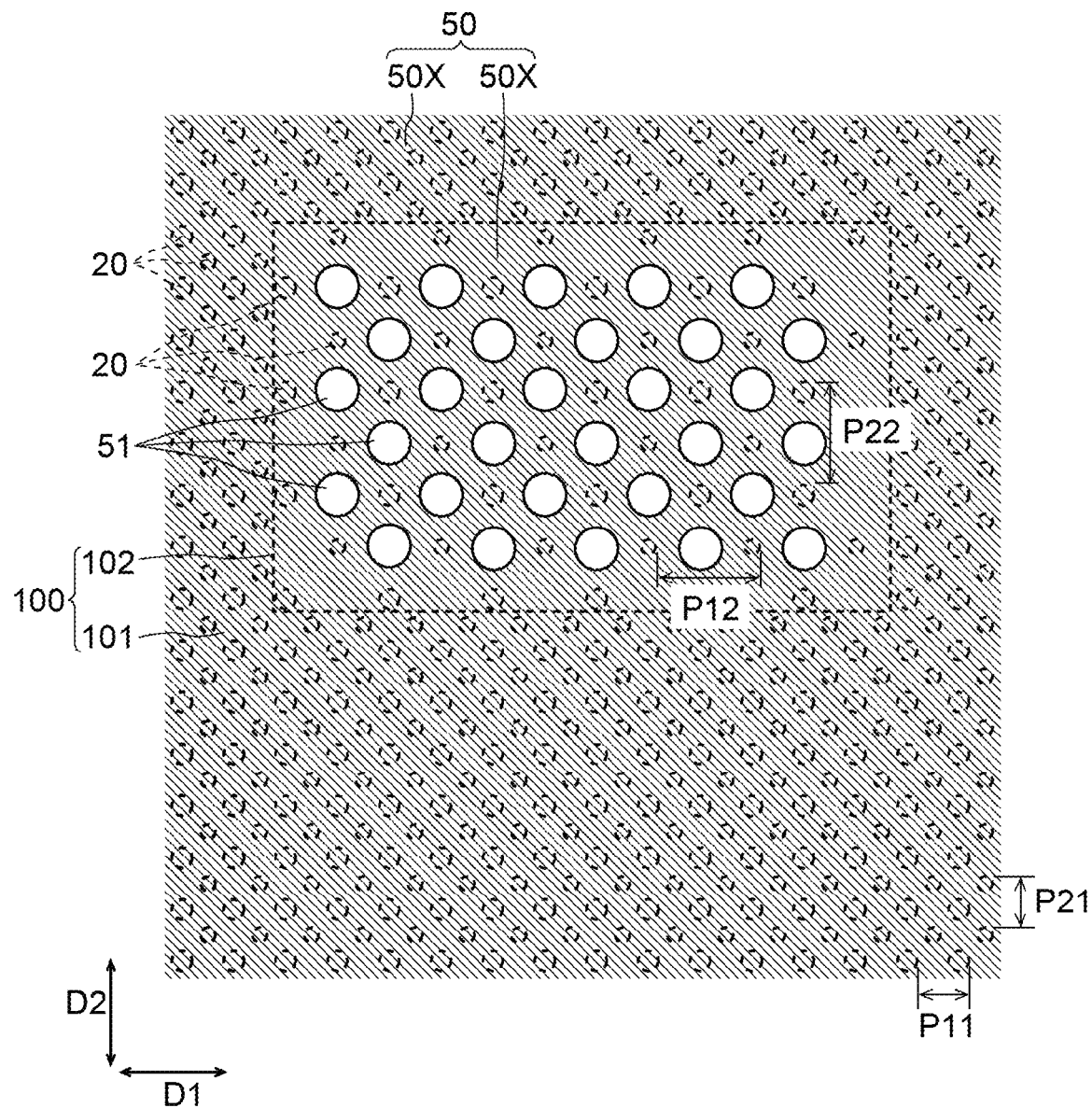
FIG. 24 is a plan view showing examples of the first display area and the second display area.

In FIGS. 2, 3, and 5, the after-mentioned FIGS. 22 to 24, and the after-mentioned examples, circles are employed as the shapes of the organic layers 40 and the apertures 51 in planar view for ease of explanation of a technical idea of the present embodiment. However, the shapes of the organic layers 40 and the apertures 51 are not limited to circles. In the other drawings, rectangles having curved corners are employed as the shapes of the organic layers 40 and the apertures 51.

As shown in FIG. 5, some of the apertures 51 have aperture center points 51C that do not coincide with unit region center points 57C. That is, the electronic device 10 includes a plurality of apertures 51 including aperture center points 51C displaced with respect to unit region center points 57C. The unit region center points 57C are center points of the after-mentioned unit regions 57. The unit regions 57 are regions defined based on the regularly arranged first electrodes 30. In a case where the aperture center points 51C of all apertures 51 coincide with the unit region center points 57C, the arrangement of the apertures 51 is so high in regularity that rays of diffracted light easily intensify one another. The inclusion by some of the apertures 51 of aperture center points 51C that do not coincide with the unit region center points 57C makes it possible to reduce the regularity of the arrangement of the apertures 51. This makes it possible to restrain high-intensity diffracted light from falling on an optical component such as a sensor.

Some of the apertures 51 may be categorized as D11 apertures or D12 apertures according to directions of displacement of the aperture center points 51C with respect to the unit region center points 57C. A D11 aperture is an aperture 51 including an aperture center point 51C displaced toward a D11 side with respect to a unit region center point 57C. A D12 aperture is an aperture 51 including an aperture center point 51C displaced toward a D12 side with respect to a unit region center point 57C. The terms "D11 side" and "D12 side" both represent directions in planar view. That is, the terms "D11 side" and "D12 side" both represent vectors. The D11 side and the D12 side are both along the first direction D1. The D12 side is a side opposite to the D11 side. In FIG. 5, the D11 side is a right side, and the D12 side is a left side.

Some of the apertures 51 may be categorized as D21 apertures or D22 apertures according to the directions of displacement of the aperture center points 51C with respect to the unit region center points 57C. A D21 aperture is an aperture 51 including an aperture center point 51C displaced toward a D21 side with respect to a unit region center point 57C. A D22 aperture is an aperture 51 including an aperture center point 51C displaced toward a D22 side with respect to a unit region center point 57C. The terms "D21 side" and "D22 side" both represent directions in planar view. That is, the terms "D21 side" and "D22 side" both represent vectors. The D21 side and the D22 side are both along the second direction D2 orthogonal to the first direction D1. The D22 side is a side opposite to the D21 side. In FIG. 5, the D21 side is an upper side, and the D22 side is a lower side.

The aperture center point 51C of an aperture 51 may be displaced toward the D11 side or the D12 side with respect to a unit region center point 57C and be further displaced toward the D21 side or the D22 side with respect to the unit region center point 57C. That is, the plurality of apertures 51 may include apertures 51 falling under the category of D11 apertures or D12 apertures and further falling under the category of D21 apertures or D22 apertures.

The plurality of apertures 51 may include a plurality of P1 apertures 51P1, a plurality of P2 apertures 51P2, a plurality of P3 apertures 51P3, a plurality of P4 apertures 51P4, a plurality of P5 apertures 51P5, a plurality of P6 apertures 51P6, a plurality of P7 apertures 51P7, a plurality of P8 apertures 51P8, and a plurality of P9 apertures 51P9.

The P1 apertures 51P1 are apertures 51 falling under the category of D11 apertures but not falling under the category of D21 apertures or D22 apertures.

The P2 apertures 51P2 are apertures 51 falling under the category of D11 apertures and falling under the category of D21 apertures.

The P3 apertures 51P3 are apertures 51 falling under the category of D21 apertures but not falling under the category of D11 apertures or D12 apertures.

The P4 apertures 51P4 are apertures 51 falling under the category of D21 apertures and falling under the category of D12 apertures.

The P5 apertures 51P5 are apertures 51 falling under the category of D12 apertures but not falling under the category of D21 apertures or D22 apertures.

The P6 apertures 51P6 are apertures 51 falling under the category of D12 apertures and falling under the category of D22 apertures.

The P7 apertures 51P7 are apertures 51 falling under the category of D22 apertures but not falling under the category of D11 apertures or D12 apertures.

The P8 apertures 51P8 are apertures 51 falling under the category of D22 apertures and falling under the category of D11 apertures.

The P9 apertures 51P9 are apertures 51 not falling under the category of D11 apertures, D12 apertures, D21 apertures, or D22 apertures.

The P1 apertures 51P1, the P2 apertures 51P2, and the P8 apertures 51P8 fall under the category of D11 apertures.

The P2 apertures 51P2, the P3 apertures 51P3, and the P4 apertures 51P4 fall under the category of D21 apertures.

The P4 apertures 51P4, the P5 apertures 51P5, and the P6 apertures 51P6 fall under the category of D12 apertures.

The P6 apertures 51P6, the P7 apertures 51P7, and the P8 apertures 51P8 fall under the category of D22 apertures.

The plurality of apertures 51 may include all of the P1 to P9 apertures 51P1 to 51P9. The plurality of apertures 51 may include some of the P1 to P9 apertures 51P1 to 51P9. For example, the plurality of apertures 51 may include the plurality of P1 apertures 51P1, the P3 apertures 51P3, the P5 apertures 51P5, the P7 apertures 51P7, and the P9 apertures 51P9, and may not include the P2 apertures 51P2, the P4 apertures 51P4, the P6 apertures 51P6, or the P8 apertures 51P8.

It is preferable that the ratios of the P1 to P9 apertures 51P1 to 51P9 be balanced. For example, it is preferable that a difference between a minimum P ratio R1 and a maximum P ratio R2 be small. The minimum P ratio R1 is the number of apertures that are smallest in number of the P1 to P9 apertures 51P1 to 51P9. The maximum P ratio R2 is the number of apertures that are largest in number of the P1 to P9 apertures 51P1 to 51P9.

R2/R1, which is the ratio of the maximum P ratio R2 to the minimum P ratio R1, may for example be higher than or equal to 1.00, higher than or equal to 1.10, or higher than or equal to 1.20. R2/R1 may for example be lower than or equal to 1.50, lower than or equal to 2.00, or lower than or equal to 3.00. R2/R1 may fall within a range defined by a first group consisting of 1.00, 1.10, and 1.20 and/or a second group consisting of 1.50, 2.00, and 3.00. R2/R1 may fall within a range defined by a combination of any one of the values included in the aforementioned first group and any one of the values included in the aforementioned second group. R2/R1 may fall within a range defined by a combination of any two of the values included in the aforementioned first group. R2/R1 may fall within a range defined by a combination of any two of the values included in the aforementioned second group. R2/R1 may for example be higher than or equal to 1.00 and lower than or equal to 3.00, higher than or equal to 1.00 and lower than or equal to 2.00, higher than or equal to 1.00 and lower than or equal to 1.50, higher than or equal to 1.00 and lower than or equal to 1.20, higher than or equal to 1.00 and lower than or equal to 1.10, higher than or equal to 1.10 and lower than or equal to 3.00, higher than or equal to 1.10 and lower than or equal to 2.00, higher than or equal to 1.10 and lower than or equal to 1.50, higher than or equal to 1.10 and lower than or equal to 1.20, higher than or equal to 1.20 and lower than or equal to 3.00, higher than or equal to 1.20 and lower than or equal to 2.00, higher than or equal to 1.20 and lower than or equal to 1.50, higher than or equal to 1.50 and lower than or equal to 3.00, higher than or equal to 1.50 and lower than or equal to 2.00, or higher than or equal to 2.00 and lower than or equal to 3.00.

The numbers of P1 to P9 apertures 51P1 to 51P9 are measured all over the second display area 102.

In a method for measuring the shapes and arrangement of the apertures 51, light is let in the electronic device 10. Then, an image in the second display area 102 that is generated based on light reflected by the electronic device 10 is analyzed. The shapes and arrangement of the apertures 51 can be calculated based on a difference between the reflectance of light in regions overlapping, for example, the first electrodes 30 and the second electrode 50 and the reflectance of light in regions overlapping the apertures 51.

Figure 6:
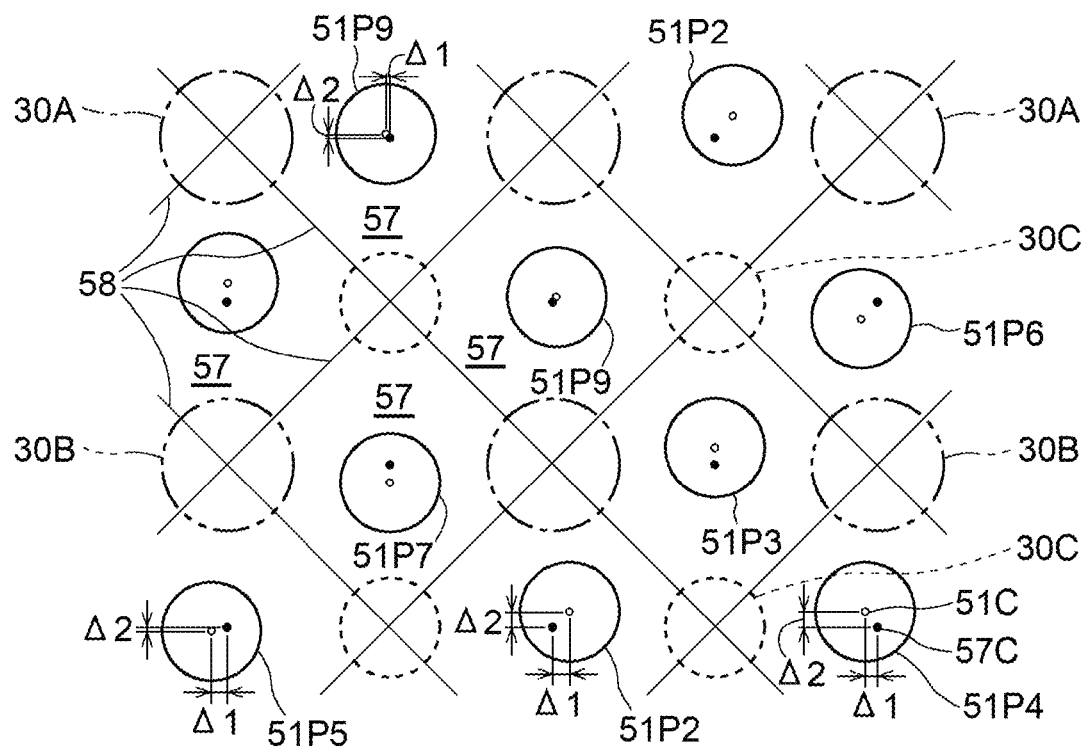
FIG. 6 is an enlarged plan view of the second electrode of FIG. 5.
Figure 6:
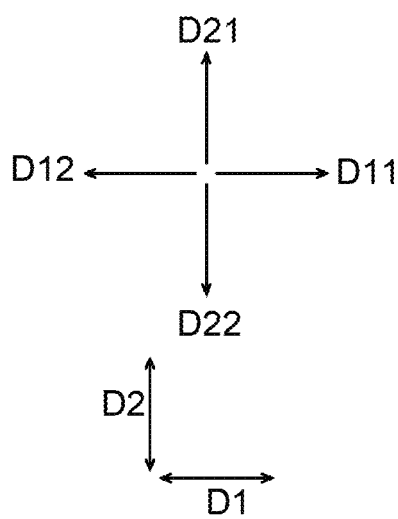

Next, the unit regions 57 are described. FIG. 6 is an enlarged plan view of the plurality of apertures 51 of the second electrode 50 of FIG. 5.

The second electrode 50 includes a plurality of unit regions 57 demarcated based on the plurality of first electrodes 30. The apertures 51 are located in the unit regions 57. One aperture 51 may be formed in one unit region 57. Although not illustrated, two or more apertures 51 may be formed in one unit region 57. At least one aperture 51 may be formed in every one of all unit regions 57 of the second display area 102. Although not illustrated, the second display area 102 may include a unit region 57 in which no aperture 51 is formed.

As shown in FIG. 6, each of the unit regions 57 may have the shape of a polygon demarcated by lines of demarcation 58 connecting center points of first electrodes 30. For example, each of the unit regions 57 may be demarcated by a quadrangle that is obtained by connecting center points of four of the first electrodes 30. The four of the first electrodes 30 corresponding to the quadrangle may include at least one of the A1 electrodes 30A, at least one of the A2 electrodes 30B, and at least one of the A3 electrodes 30C. For example, as shown in FIG. 6, the four of the first electrodes 30 corresponding to the quadrangle may include one of the A1 electrodes 30A, one of the A2 electrodes 30B, and two of the A3 electrodes 30C. The one A1 electrode 30A and the one A2 electrode 30B may be adjacent to each other in the first direction D1. The two A3 electrodes 30C may be adjacent to each other in the second direction D2. Each of the unit region center points 57C is defined, for example, as a point of intersection of two straight lines each joining opposite corners of the quadrangle of the corresponding one of the unit regions 57.

Each of the aperture center points 51C is for example the barycenter of the corresponding one of the apertures 51 in planar view. The barycenter of each of the apertures 51 is calculated, for example, by analyzing an image in the second display area 102 that is generated based on light reflected by the electronic device 10.

In FIG. 6, Δ1 denotes the amount of displacement in the first direction D1 between an aperture center point 51C and a unit region center point 57C. The phrase "displaced toward the D11 side" or "displaced toward the D12 side" herein means that Δ1 is greater than or equal to a first threshold TH1. For example, the phrase "displaced toward the D11 side" means that an aperture center point 51C is displaced by TH1 or more toward the D11 side with respect to a unit region center point 57C. For example, the phrase "displaced toward the D12 side" means that an aperture center point 51C is displaced by TH1 or more toward the D12 side with respect to a unit region center point 57C.

TH1 may for example be greater than or equal to 1 μm, greater than or equal to 3 μm, greater than or equal to 5 μm, or greater than or equal to 7 μm. TH1 may for example be less than or equal to 9 μm, less than or equal to 11 μm, less than or equal to 13 μm, or less than or equal to 15 μm. TH1 may fall within a range defined by a first group consisting of 1 μm, 3 μm, 5 μm, and 7 μm and/or a second group consisting of 9 μm, 11 μm, 13 μm, and 15 μm. TH1 may fall within a range defined by a combination of any one of the values included in the aforementioned first group and any one of the values included in the aforementioned second group. TH1 may fall within a range defined by a combination of any two of the values included in the aforementioned first group. TH1 may fall within a range defined by a combination of any two of the values included in the aforementioned second group. TH1 may for example be greater than or equal to 1 μm and less than or equal to 15 μm, greater than or equal to 1 μm and less than or equal to 13 μm, greater than or equal to 1 μm and less than or equal to 11 μm, greater than or equal to 1 μm and less than or equal to 9 μm, greater than or equal to 1 μm and less than or equal to 7 μm, greater than or equal to 1 μm and less than or equal to 5 μm, greater than or equal to 1 μm and less than or equal to 3 μm, greater than or equal to 3 μm and less than or equal to 15 μm, greater than or equal to 3 μm and less than or equal to 13 μm, greater than or equal to 3 μm and less than or equal to 11 μm, greater than or equal to 3 μm and less than or equal to 9 μm, greater than or equal to 3 μm and less than or equal to 7 μm, greater than or equal to 3 μm and less than or equal to 5 μm, greater than or equal to 5 μm and less than or equal to 15 μm, greater than or equal to 5 μm and less than or equal to 13 μm, greater than or equal to 5 μm and less than or equal to 11 μm, greater than or equal to 5 μm and less than or equal to 9 μm, greater than or equal to 5 μm and less than or equal to 7 μm, greater than or equal to 7 μm and less than or equal to 15 μm, greater than or equal to 7 μm and less than or equal to 13 μm, greater than or equal to 7 μm and less than or equal to 11 μm, greater than or equal to 7 μm and less than or equal to 9 μm, greater than or equal to 9 μm and less than or equal to 15 μm, greater than or equal to 9 μm and less than or equal to 13 μm, greater than or equal to 9 μm and less than or equal to 11 μm, greater than or equal to 11 μm and less than or equal to 15 μm, greater than or equal to 11 μm and less than or equal to 13 μm, or greater than or equal to 13 μm and less than or equal to 15 μm.

TH1 may be set as a relative value with respect to a pitch P12. The pitch P12 is a pitch at which first electrodes 30 are arrayed in the first direction D1. TH1/P12, which is the ratio of TH1 to the pitch P12, may for example be higher than or equal to 0.003, higher than or equal to 0.01, higher than or equal to 0.03, higher than or equal to 0.05, or higher than or equal to 0.07. TH1/P12 may for example be lower than or equal to 0.09, lower than or equal to 0.11, lower than or equal to 0.13, or lower than or equal to 0.15. TH1/P12 may fall within a range defined by a first group consisting of 0.003, 0.01, 0.03, 0.05, and 0.07 and/or a second group consisting of 0.09, 0.11, 0.13, and 0.15. TH1/P12 may fall within a range defined by a combination of any one of the values included in the aforementioned first group and any one of the values included in the aforementioned second group. TH1/P12 may fall within a range defined by a combination of any two of the values included in the aforementioned first group. TH1/P12 may fall within a range defined by a combination of any two of the values included in the aforementioned second group. TH1/P12 may for example be higher than or equal to 0.003 and lower than or equal to 0.15, higher than or equal to 0.003 and lower than or equal to 0.13, higher than or equal to 0.003 and lower than or equal to 0.11, higher than or equal to 0.003 and lower than or equal to 0.09, higher than or equal to 0.003 and lower than or equal to 0.07, higher than or equal to 0.003 and lower than or equal to 0.05, higher than or equal to 0.003 and lower than or equal to 0.03, higher than or equal to 0.01 and lower than or equal to 0.15, higher than or equal to 0.01 and lower than or equal to 0.13, higher than or equal to 0.01 and lower than or equal to 0.11, higher than or equal to 0.01 and lower than or equal to 0.09, higher than or equal to 0.01 and lower than or equal to 0.07, higher than or equal to 0.01 and lower than or equal to 0.05, higher than or equal to 0.01 and lower than or equal to 0.03, higher than or equal to 0.03 and lower than or equal to 0.15, higher than or equal to 0.03 and lower than or equal to 0.13, higher than or equal to 0.03 and lower than or equal to 0.11, higher than or equal to 0.03 and lower than or equal to 0.09, higher than or equal to 0.03 and lower than or equal to 0.07, higher than or equal to 0.03 and lower than or equal to 0.05, higher than or equal to 0.05 and lower than or equal to 0.15, higher than or equal to 0.05 and lower than or equal to 0.13, higher than or equal to 0.05 and lower than or equal to 0.11, higher than or equal to 0.05 and lower than or equal to 0.09, higher than or equal to 0.05 and lower than or equal to 0.07, higher than or equal to 0.07 and lower than or equal to 0.15, higher than or equal to 0.07 and lower than or equal to 0.13, higher than or equal to 0.07 and lower than or equal to 0.11, higher than or equal to 0.07 and lower than or equal to 0.09, higher than or equal to 0.09 and lower than or equal to 0.15, higher than or equal to 0.09 and lower than or equal to 0.13, higher than or equal to 0.09 and lower than or equal to 0.11, higher than or equal to 0.11 and lower than or equal to 0.15, higher than or equal to 0.11 and lower than or equal to 0.13, or higher than or equal to 0.13 and lower than or equal to 0.15.

In FIG. 6, A2 denotes the amount of displacement in the second direction D2 between an aperture center point 51C and a unit region center point 57C. The phrase "displaced toward the D21 side" or "displaced toward the D22 side" herein means that A2 is greater than or equal to a second threshold TH2. For example, the phrase "displaced toward the D21 side" means that an aperture center point 51C is displaced by TH2 or more toward the D21 side with respect to a unit region center point 57C. For example, the phrase "displaced toward the D22 side" means that an aperture center point 51C is displaced by TH2 or more toward the D22 side with respect to a unit region center point 57C. As the range of numerical values of TH2, the aforementioned range of numerical values of TH1 can be employed.

TH2 may be set as a relative value with respect to a pitch P22. The pitch P22 is a pitch at which first electrodes 30 are arrayed in the second direction D2. As the range of numerical values of TH2/P22, the aforementioned range of numerical values of TH1/P12 can be employed.

In the example shown in FIG. 6, in each of the P2 apertures 51P2, Δ1 is greater than or equal to the first threshold TH1, and A2 is greater than or equal to the second threshold TH2. Accordingly, the P2 apertures 51P2 fall under the category of D11 apertures and fall under the category of D21 apertures.

In the example shown in FIG. 6, in the P4 aperture 51P4, Δ1 is greater than or equal to the first threshold TH1, and A2 is greater than or equal to the second threshold TH2. Accordingly, the P4 aperture 51P4 falls under the category of D12 apertures and falls under the category of D21 apertures.

In the example shown in FIG. 6, in the P5 aperture P51P5, Δ1 is greater than or equal to the first threshold TH1, but A2 is less than the second threshold TH2. Accordingly, the P5 aperture P51P5 falls under the category of D12 apertures but does not fall under the category of D21 apertures or D22 apertures.

In the example shown in FIG. 6, in each of the P9 apertures 51P9, Δ1 is less than the first threshold TH1, and A2 is less than the second threshold TH2. Accordingly, the P9 apertures 51P9 do not fall under the category of D11 apertures or D12 apertures, nor do they fall under the category of D21 apertures or D22 apertures.

Next, a cross-section structure of the second electrode 50 is described.

Figure 7A:
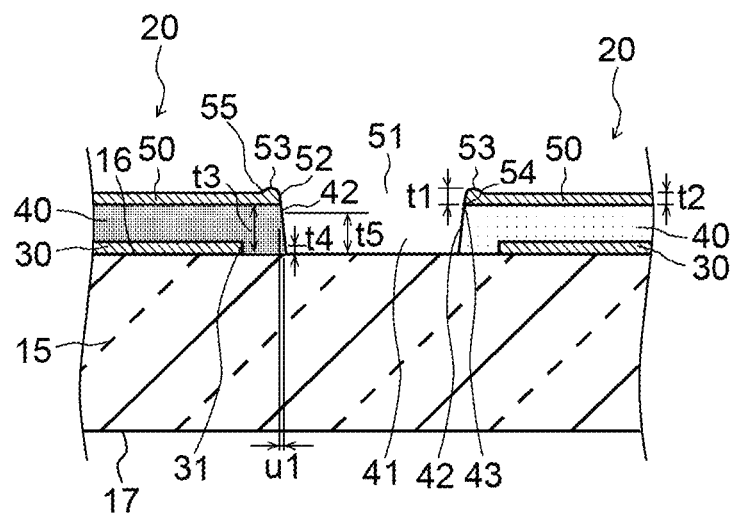
FIG. 7A is an enlarged cross-sectional view of the second display area of FIG. 4.

FIG. 7A is an enlarged cross-sectional view of the second display area 102 of FIG. 4. The second electrode 50 includes side surfaces 52 facing the apertures 51. Similarly, the organic layers 40 include side surfaces 42 facing the organic layer apertures 41. As shown in FIG. 7A, upper ends 43 of the side surfaces 42 of the organic layers 40 may be in contact with lower ends 54 of the side surfaces 52 of the second electrode 50. Such a relationship between the side surfaces 42 and the side surfaces 52 can be achieved in a case where the organic layer apertures 41 and the apertures 51 are formed by laser processing.

Figure 7B:
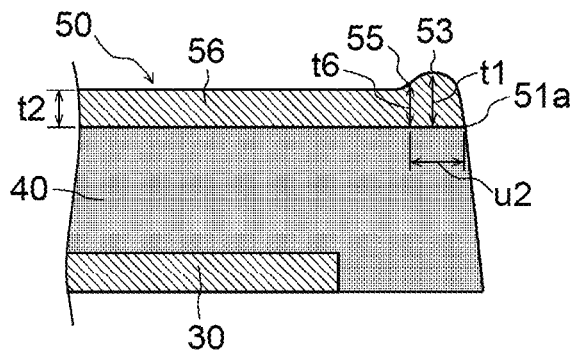
FIG. 7B is an enlarged cross-sectional view of the second electrode of FIG. 7A.

FIG. 7B is an enlarged cross-sectional view of the second electrode 50 of FIG. 7A. As shown in FIGS. 7A and 7B, upper ends 53 of the side surfaces 52 of the second electrode 50 may be raised above surrounding parts of the second electrode 50. Such raised parts can be formed by the second electrode 50 melting during laser processing. The raising of the upper ends 53 of the side surfaces 52 of the second electrode 50 leads to an increase in height of the side surfaces 52 of the second electrode 50, thus making it possible to reduce the electric resistance of the second electrode 50.

In FIGS. 7A and 7B, reference sign $t1$ denotes the height of each of the side surfaces 52 of the second electrode 50. Further, reference sign $t2$ denotes the average of the thicknesses of regions of the second electrode 50 that overlap a first electrode 30 in planar view. The height $t1$ is the distance between the upper end 53 and the lower end 54 of each of the side surfaces 52 in the direction normal to the first surface 16 of the substrate 15. The height $t1$ of each of the side surfaces 52 and the thickness of the second electrode 50 are calculated based on a cross-sectional image of the electronic device 10. The cross-sectional image is obtained by observing a cross-section of the electronic device 10 with a scanning electron microscope.

Figure 7C:
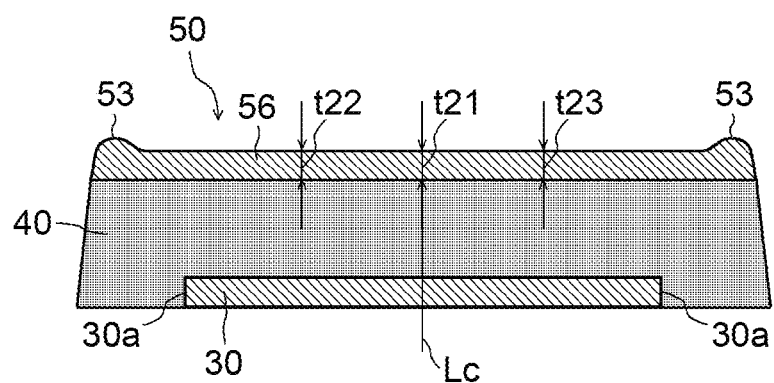
FIG. 7C is a diagram for explaining a method for calculating an average thickness of the second electrode.

A method for calculating the average thickness $t2$ of the second electrode 50 is described with reference to FIG. 7C. The average $t2$ is calculated by averaging a thickness $t21$, a thickness $t22$, and a thickness $t23$. The thickness $t21$ is the thickness of a portion of the second electrode 50 that overlaps the center of a first electrode 30 in the in-plane direction of the first surface 16. In FIG. 7C, a straight line passing through the center of the first electrode 30 and extending in a direction parallel with the thickness of the substrate 15 is denoted by reference sign Lc. The thicknesses $t22$ and $t23$ are the thicknesses of portions of the second electrode 50 each located between an end 30a of the first electrode 30 and the straight line Lc in the in-plane direction of the first surface 16.

The height $t1$ of each of the side surfaces 52 may be greater than the average thickness $t2$ of the second electrode 50. That is, $t1/t2$ may be higher than 1.0. $t1/t2$ may for example be higher than or equal to 1.1, higher than or equal to 1.2, higher than or equal to 1.3, or higher than or equal to 1.4. $t1/t2$ may for example be lower than or equal to 1.5, lower than or equal to 1.6, lower than or equal to 1.8, or lower than or equal to 2.0. $t1/t2$ may fall within a range defined by a first group consisting of 1.1, 1.2, 1.3, and 1.4 and/or a second group consisting of 1.5, 1.6, 1.8, and 2.0. $t1/t2$ may fall within a range defined by a combination of any one of the values included in the aforementioned first group and any one of the values included in the aforementioned second group. $t1/t2$ may fall within a range defined by a combination of any two of the values included in the aforementioned first group. $t1/t2$ may fall within a range defined by a combination of any two of the values included in the aforementioned second group. $t1/t2$ may for example be higher than or equal to 1.1 and lower than or equal to 2.0, higher than or equal to 1.1 and lower than or equal to 1.8, higher than or equal to 1.1 and lower than or equal to 1.6, higher than or equal to 1.1 and lower than or equal to 1.5, higher than or equal to 1.1 and lower than or equal to 1.4, higher than or equal to 1.1 and lower than or equal to 1.3, higher than or equal to 1.1 and lower than or equal to 1.2, higher than or equal to 1.2 and lower than or equal to 2.0, higher than or equal to 1.2 and lower than or equal to 1.8, higher than or equal to 1.2 and lower than or equal to 1.6, higher than or equal to 1.2 and lower than or equal to 1.5, higher than or equal to 1.2 and lower than or equal to 1.4, higher than or equal to 1.2 and lower than or equal to 1.3, higher than or equal to 1.3 and lower than or equal to 2.0, higher than or equal to 1.3 and lower than or equal to 1.8, higher than or equal to 1.3 and lower than or equal to 1.6, higher than or equal to 1.3 and lower than or equal to 1.5, higher than or equal to 1.3 and lower than or equal to 1.4, higher than or equal to 1.4 and lower than or equal to 2.0, higher than or equal to 1.4 and lower than or equal to 1.8, higher than or equal to 1.4 and lower than or equal to 1.6, higher than or equal to 1.4 and lower than or equal to 1.5, higher than or equal to 1.5 and lower than or equal to 2.0, higher than or equal to 1.5 and lower than or equal to 1.8, higher than or equal to 1.5 and lower than or equal to 1.6, higher than or equal to 1.6 and lower than or equal to 2.0, higher than or equal to 1.6 and lower than or equal to 1.8, or higher than or equal to 1.8 and lower than or equal to 2.0.

In a case where the organic layer apertures 41 are formed in the organic layers 40 by laser processing, adjusting the direction of irradiation with light makes it possible to adjust an angle that the side surfaces 42 facing the organic layer apertures 41 form with respect to the first surface 16 of the substrate 15. This makes it possible, for example, to form the organic layer apertures 41 so that the side surfaces 42 sharply rise. In this case, the width $u1$ of each of the side surfaces 42 of the organic layers 40 is smaller than the width of a side surface of an organic layer that is formed by a deposition method. Since the side surfaces 42 of the organic layers 40 sharply rise, variations in the effective areas of the organic layers 40 are reduced. This reduces variations in the characteristics of the organic layers 40. For example, in a case where the organic layers 40 are luminescent layers, variations in the luminous intensity of light from the luminescent layers are reduced. This makes it possible to restrain a luminance distribution of the electronic device 10 from varying from place to place in the plane of the electronic device 10. The "effective area of an organic layer 40" means the area of a portion of the organic layer 40 that has a thickness needed for the organic layer 40 to fulfill its function and that overlaps a first electrode 30 and the second electrode 50 in planar view.

The width $u1$ of each of the side surfaces 52 is herein defined as the distance in the in-plane direction of the first surface 16 from a place at which the height of the side surface 52 reaches $t4$ to a place at which the height of the side surface 52 reaches $t5$. $t4$ is $0.2 \times t3$, and $t5$ is $0.8 \times t3$. Reference sign $t3$ denotes the average of the thicknesses of regions of each of the organic layers 40 each located between a side surface 42 and an end 31 of a first electrode 30 in planar view. As is the case with the thickness of the second electrode 50, the thickness of each of the organic layers 40 is calculated based on a cross-sectional image of the electronic device 10.

The width u1 may for example be greater than or equal to 0.1 µm, greater than or equal to 0.2 µm, greater than or equal to 0.3 µm, or greater than or equal to 0.4 µm. The width u1 may for example be less than or equal to 0.5 µm, less than or equal to 1.0 µm, less than or equal to 1.5 µm, or less than or equal to 2.0 µm. The width u1 may fall within a range defined by a first group consisting of 0.1 µm, 0.2 µm, 0.3 µm, and 0.4 µm and/or a second group consisting of 0.5 µm, 1.0 µm, 1.5 µm, and 2.0 µm. The width u1 may fall within a range defined by a combination of any one of the values included in the aforementioned first group and any one of the values included in the aforementioned second group. The width u1 may fall within a range defined by a combination of any two of the values included in the aforementioned first group. The width u1 may fall within a range defined by a combination of any two of the values included in the aforementioned second group. The width u1 may for example be greater than or equal to 0.1 µm and less than or equal to 2.0 µm, greater than or equal to 0.1 µm and less than or equal to 1.5 µm, greater than or equal to 0.1 µm and less than or equal to 1.0 µm, greater than or equal to 0.1 µm and less than or equal to 0.5 µm, greater than or equal to 0.1 µm and less than or equal to 0.4 µm, greater than or equal to 0.1 µm and less than or equal to 0.3 µm, greater than or equal to 0.1 µm and less than or equal to 0.2 µm, greater than or equal to 0.2 µm and less than or equal to 2.0 µm, greater than or equal to 0.2 µm and less than or equal to 1.5 µm, greater than or equal to 0.2 µm and less than or equal to 1.0 µm, greater than or equal to 0.2 µm and less than or equal to 0.5 µm, greater than or equal to 0.2 µm and less than or equal to 0.4 µm, greater than or equal to 0.2 µm and less than or equal to 0.3 µm, greater than or equal to 0.3 µm and less than or equal to 2.0 µm, greater than or equal to 0.3 µm and less than or equal to 1.5 µm, greater than or equal to 0.3 µm and less than or equal to 1.0 µm, greater than or equal to 0.3 µm and less than or equal to 0.5 µm, greater than or equal to 0.3 µm and less than or equal to 0.4 µm, greater than or equal to 0.4 µm and less than or equal to 2.0 µm, greater than or equal to 0.4 µm and less than or equal to 1.5 µm, greater than or equal to 0.4 µm and less than or equal to 1.0 µm, greater than or equal to 0.4 µm and less than or equal to 0.5 µm, greater than or equal to 0.5 µm and less than or equal to 2.0 µm, greater than or equal to 0.5 µm and less than or equal to 1.5 µm, greater than or equal to 0.5 µm and less than or equal to 1.0 µm, greater than or equal to 1.0 µm and less than or equal to 2.0 µm, greater than or equal to 1.0 µm and less than or equal to 1.5 µm, or greater than or equal to 1.5 µm and less than or equal to 2.0 µm.

In a case where the side surfaces 52 of the second electrode 50 are raised, the second electrode 50 includes basal portions 55 located outside the upper ends 53 as shown in FIGS. 7A and 7B. The second electrode 50 decreases in thickness outward from the upper ends 53. The term "outward" means "away from the centers of the apertures 51 in planar view". The basal portions 55 are places at which the thickness of the second electrode 50 is sufficiently smaller than the height t1 of each of the side surfaces 52. For example, the thickness t6 of each of the basal portions 55 of the second electrode 50 is 1.05 times as great as the average thickness t2 of the second electrode 50.

Figure 8:
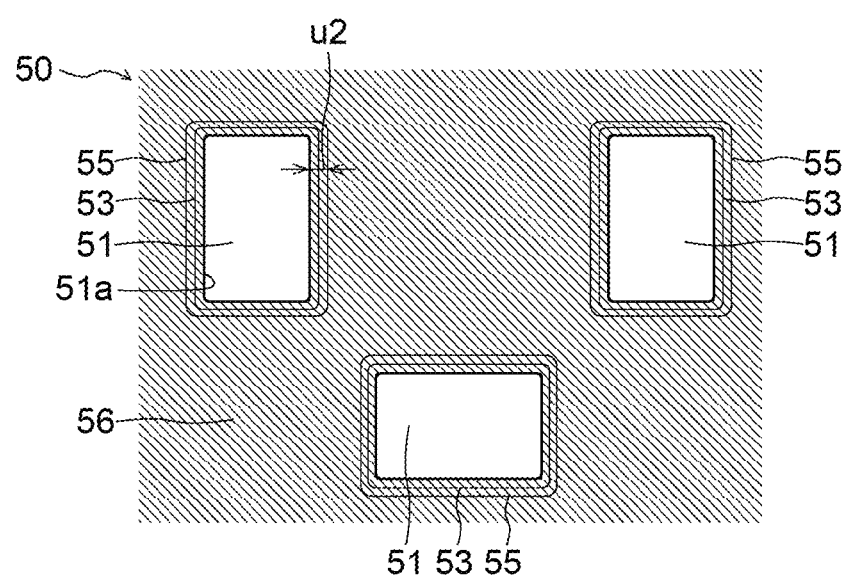
FIG. 8 is a plan view showing an example of the second electrode.

FIG. 8 is a plan view showing an example of the second electrode 50. Reference sign 51a denotes the outer edge of each of the apertures 51 in planar view. The upper ends 53 of the side surfaces 52 of the second electrode 50 may have contours surrounding the apertures 51 in planar view. The basal portions 55 may have contours surrounding the contours of the upper ends 53 in planar view.

Reference sign u2 denotes the distance in planar view from the outer edge 51a of each of the apertures 51 to the corresponding one of the basal portions 55. The distance u2 may for example be greater than or equal to 0.05 µm, greater than or equal to 0.1 µm, or greater than or equal to 0.5 µm. The distance u2 may for example be less than or equal to 2.0 µm, less than or equal to 3.0 µm, or less than or equal to 5.0 µm. The distance u2 may fall within a range defined by a first group consisting of 0.05 µm, 0.1 µm, and 0.5 µm and/or a second group consisting of 2.0 µm, 3.0 µm, and 5.0 µm. The distance u2 may fall within a range defined by a combination of any one of the values included in the aforementioned first group and any one of the values included in the aforementioned second group. The distance u2 may fall within a range defined by a combination of any two of the values included in the aforementioned first group. The distance u2 may fall within a range defined by a combination of any two of the values included in the aforementioned second group. The distance u2 may for example be greater than or equal to 0.05 µm and less than or equal to 5.0 µm, greater than or equal to 0.05 µm and less than or equal to 3.0 µm, greater than or equal to 0.05 µm and less than or equal to 2.0 µm, greater than or equal to 0.05 µm and less than or equal to 0.5 µm, greater than or equal to 0.05 µm and less than or equal to 0.1 µm, greater than or equal to 0.1 µm and less than or equal to 5.0 µm, greater than or equal to 0.1 µm and less than or equal to 3.0 µm, greater than or equal to 0.1 µm and less than or equal to 2.0 µm, greater than or equal to 0.1 µm and less than or equal to 0.5 µm, greater than or equal to 0.5 µm and less than or equal to 5.0 µm, greater than or equal to 0.5 µm and less than or equal to 3.0 µm, greater than or equal to 0.5 µm and less than or equal to 2.0 µm, greater than or equal to 2.0 µm and less than or equal to 5.0 µm, greater than or equal to 2.0 µm and less than or equal to 3.0 µm, or greater than or equal to 3.0 µm and less than or equal to 5.0 µm.

The dimensions of the constituent elements of the electronic devices 10, the distances between the constituent elements, or other values can be measured by observing a cross-sectional image of the electronic device 10 with a scanning electron microscope.

The second electrode 50 may include a homogenous region 56. The homogenous region 56 is for example a region having a thickness 1.05 times or less as great as the average t2. The homogenous region 56 spreads so as to surround the apertures 51 in planar view. The homogenous region 56 may spread outside the basal portions 55. The homogenous region 56 may occupy a large portion of the second electrode 50. The occupancy rate of the homogenous region 56 in the second electrode 50 may for example be higher than or equal to 90%, higher than or equal to 95%, higher than or equal to 98%, or higher than or equal to 99%. In a case where a large portion of the second electrode 50 is the homogenous region 56, light is easily transmitted through the second electrode 50. This makes it possible to increase the transmittance of the electronic device 10.

Next, an example of a manufacturing method for the aforementioned electronic device 10 is described.

Figure 9:
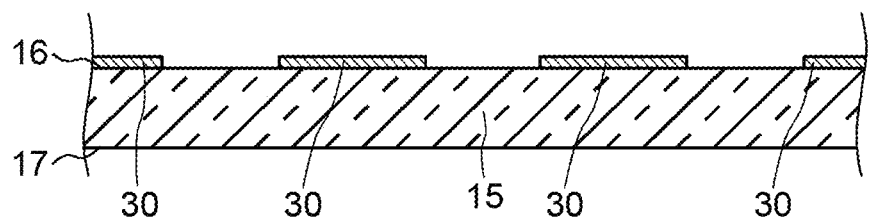
FIG. 9 is a cross-sectional view showing an example of a substrate with first electrodes formed thereon.
Figure 10:
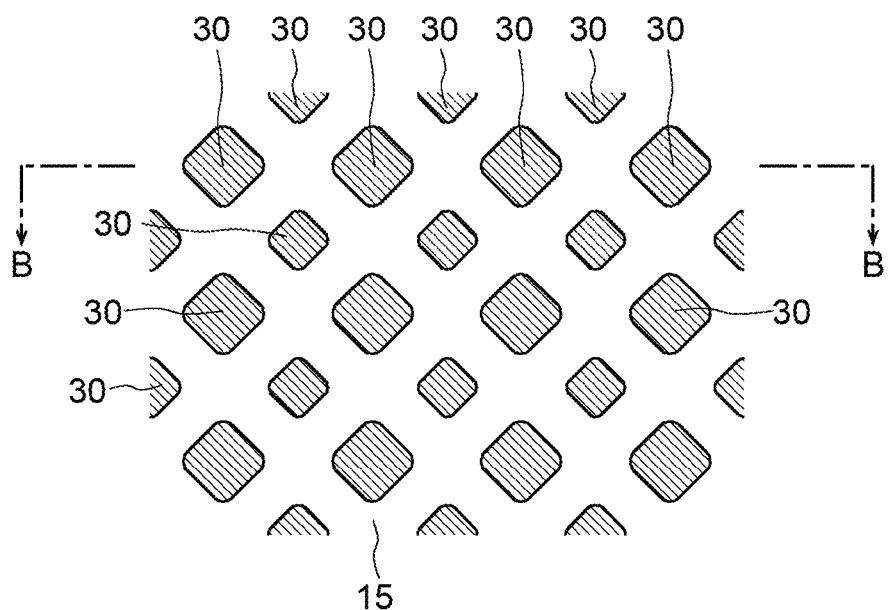
FIG. 10 is a plan view showing an example of a substrate with first electrodes formed thereon.

First, a substrate 15 with first electrodes 30 formed thereon is prepared. FIGS. 9 and 10 are a cross-sectional view and a plan view, respectively, showing the substrate 15 with the first electrodes 30 formed thereon. FIG. 9 is equivalent to a cross-sectional view of the substrate 15 as taken along line B-B in FIG. 10. The first electrodes 30 are formed, for example, by forming a conductive layer on the substrate 15 by sputtering or other processes and then patterning the conductive layer into the first electrodes 30 by a photolithography process.

Figure 11:
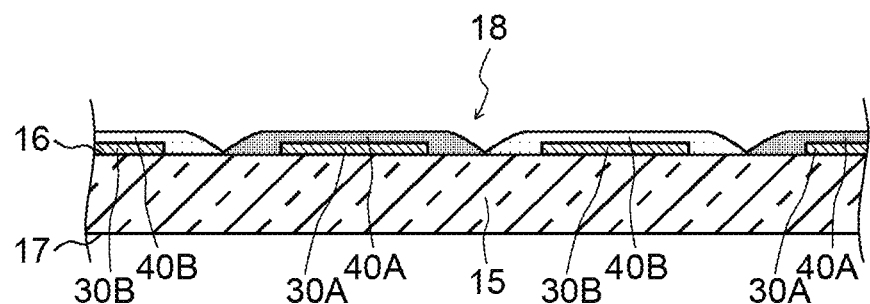
FIG. 11 is a cross-sectional view showing an example of a substrate with first electrodes and organic layers formed thereon.
Figure 12:
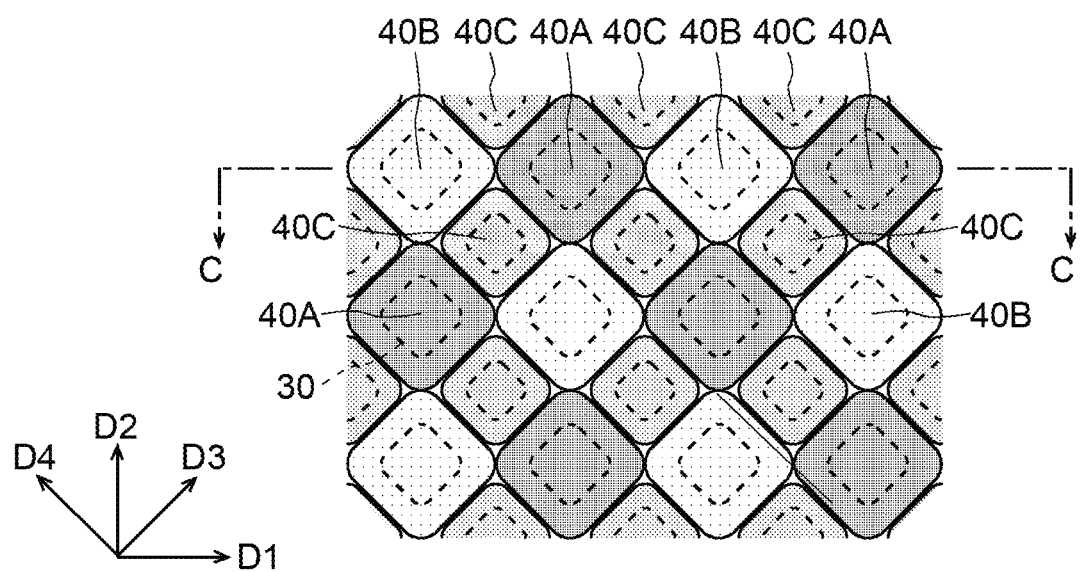
FIG. 12 is a cross-sectional view showing an example of a substrate with first electrodes and organic layers formed thereon.

Then, an organic layer forming step of forming organic layers 40 on top of the first electrodes 30 is executed. FIGS. 11 and 12 are a cross-sectional view and a plan view, respectively, showing the substrate 15 with the first electrodes 30 and the organic layers 40 formed thereon. FIG. 11 is equivalent to a cross-sectional view of the substrate 15 as taken along line C-C in FIG. 12. The organic layers 40 are formed, for example, by causing an organic material to adhere onto the substrate 15 and onto the first electrodes 30 by a deposition method that involves the use of a deposition mask having through holes corresponding to the organic layers 40. In this way, a layered product 18 including a substrate 15, two or more first electrodes 30 located on the first surface 16 of the substrate 15, and organic layers 40 located on top of the first electrodes 30 can be prepared.

As shown in FIG. 12, the first organic layers 40A may be arranged along a third direction D3 and a fourth direction D4 intersecting the third direction D3. As is the case with the first organic layers 40A, the second organic layers 40B too may be arranged along the third direction D3 and the fourth direction D4 intersecting the third direction D3. The third organic layers 40C may be arranged along the first direction D1 and the second direction D2.

Figure 13:
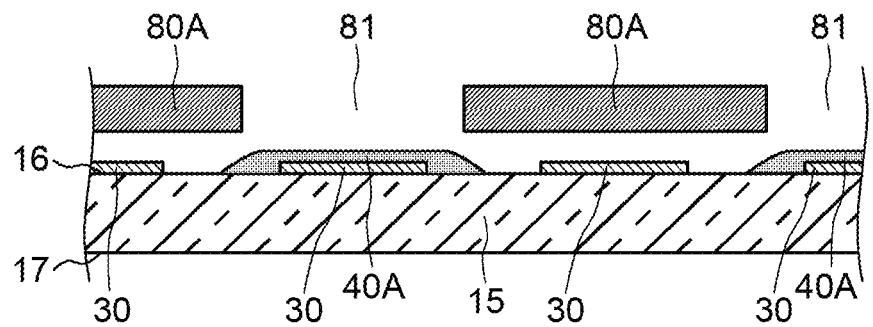
FIG. 13 is a cross-sectional view showing an example of a step of forming first organic layers.

FIG. 13 is a cross-sectional view showing an example of a step of forming the first organic layers 40A. First, a first deposition mask 80A including a plurality of through holes 81 is prepared. Then, the first deposition mask 80A is brought face-to-face with the substrate 15 with the first electrodes 30 formed on the substrate 15. Then, a first deposition step of depositing the material of the first organic layers 40A on the first electrodes 30 via the through holes 81 of the deposition mask 80A is executed. As shown in FIG. 13, the first organic layers 40A may be formed not only in regions overlapping the first electrodes 30 in planar view, but also in regions not overlapping the first electrodes 30.

Figure 14:
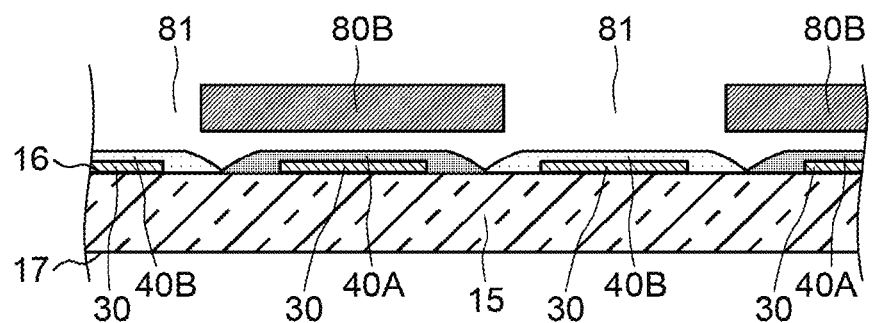
FIG. 14 is a cross-sectional view showing an example of a step of forming second organic layers.

FIG. 14 is a cross-sectional view showing an example of a step of forming the second organic layers 40B. First, a second deposition mask 80B including a plurality of through holes 81 is prepared. Then, the second deposition mask 80B is brought face-to-face with the substrate 15 with the first electrodes 30 and the first organic layers 40A formed on the substrate 15. Then, a second deposition step of depositing the material of the second organic layers 40B on the first electrodes 30 via the through holes 81 of the deposition mask 80B is executed. As shown in FIG. 14, the second organic layers 40B may be formed not only in regions overlapping the first electrodes 30 in planar view, but also in a region not overlapping the first electrodes 30.

Although not illustrated, a third deposition step of depositing the material of the third organic layers 40C on the first electrodes 30 via through holes of a deposition mask is executed as in the case of the first organic layers 40A and the second organic layers 40B. In this way, the organic layers 40, including the first organic layers 40A, the second organic layers 40B, and the third organic layers 40C, can be formed on top of the first electrodes 30.

Figure 15:
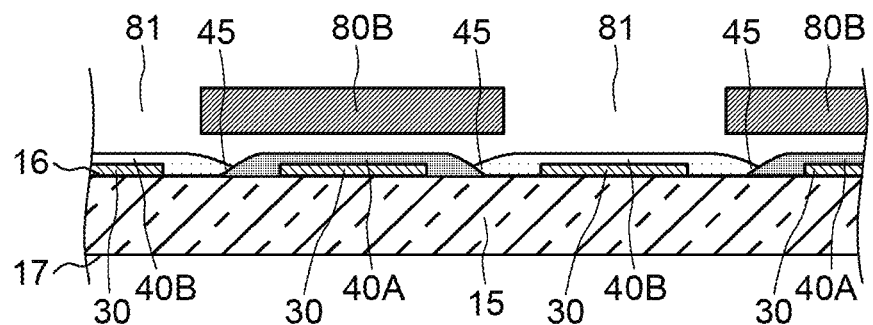
FIG. 15 is a cross-sectional view showing an example of a step of forming second organic layers.

FIG. 15 is a cross-sectional view showing another example of a step of forming the second organic layers 40B. As shown in FIG. 15, the second deposition step may be executed so that parts of the second organic layers 40B overlap the first organic layers 40A. In this case, the first organic layers 40A and the second organic layers 40B include overlap portions 45 that do not overlap the first electrodes 30 but partially overlap each other. Although not illustrated, the first organic layers 40A and the third organic layers 40C may partially overlap each other. Further, the second organic layers 40B and the third organic layers 40C may partially overlap each other.

Figure 16:
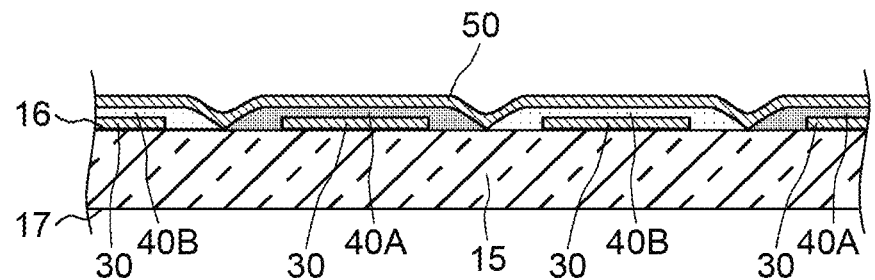
FIG. 16 is a cross-sectional view showing an example of a step of forming a second electrode.
Figure 17:
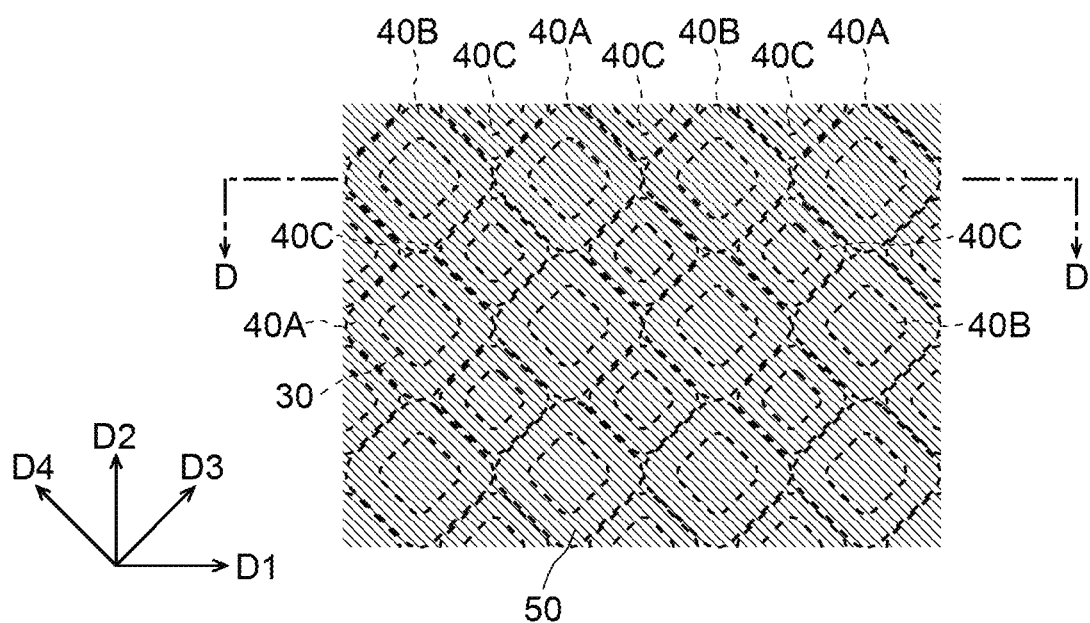
FIG. 17 is a plan view showing an example of a step of forming a second electrode.

Then, a second electrode forming step of forming a second electrode 50 is executed. FIGS. 16 and 17 are a cross-sectional view and a plan view, respectively, showing an example of the step of forming the second electrode 50. FIG. 16 is equivalent to a cross-sectional view of the substrate 15 as taken along line D-D in FIG. 17. In the second electrode forming step, the second electrode 50 is formed on top of the organic layers 40 so as to overlap two or more of the first electrodes 30 in planar view. For example, the second electrode 50 is formed all over the first surface 16 of the substrate 15 by a deposition method.

The second electrode 50 may be formed all over the display areas of the electronic device 10. The second electrode 50 may include a layer that continuously spreads in a gapless manner. The second electrode 50 may be composed of one layer that continuously spreads in a gapless manner. The second electrode 50 may be formed by a single deposition step.

Then, an aperture forming step of forming a plurality of apertures 51 in part of the second electrode 50 located in the second display area 102 is executed. The aperture forming step includes a preparing step and a removing step. The preparing step includes calculating the shapes and arrangement of the apertures 51 to be formed in the part of the second electrode 50 located in the second display area 102. The removing step includes partially removing the second electrode 50 in accordance with the shapes and arrangement calculated in the preparing step. As a result of this, apertures 51 that satisfy the shapes and arrangement calculated in the preparing step are formed in the second electrode 50.

The preparing step may include a type determining step. The type determining step includes determining types of apertures 51 to be formed in the second electrode 50. For example, the type determining step includes determining nine types of apertures 51, namely P1 to P9 apertures 51P1 to 51P9, in the second electrode 50.

The preparing step may include an amount-of-displacement determining step. The amount-of-displacement determining step includes, for example, determining the aforementioned Δ1 and Δ2.

The preparing step may include a layout step. The layout step includes determining types of apertures 51 to be formed separately in each unit region 57 of the second electrode 50. For example, the layout step may include randomly allocating any one of the P1 to P9 apertures 51P1 to 51P9 separately to each unit region 57.

The preparing step may include a ratio determining step. The ratio determining step includes determining the ratios of the numbers of P1 to P9 apertures 51P1 to 51P9 to the total number of apertures 51 to be formed in the second display area 102. The total of the ratios of the P1 to P9 apertures 51P1 to 51P9 is 100%. The ratio determining step may be executed so that R2/R1 falls within the aforementioned range. The aforementioned layout step may include allocating any one of the P1 to P9 apertures 51P1 to 51P9 separately to each unit region 57 in accordance with the ratios determined in the ratios determining step.

The preparing step may include a dimension determining step. The dimension determining step includes determining the dimensions of the apertures 51 in planar view. In the present embodiment, the P1 to P9 apertures 51P1 to 51P9 may have equal dimensions. The term "equal dimensions" means that the dimensions of each aperture 51 are greater than or equal to "Average−10%" and less than or equal to "Average+10%". The average is the average of the dimensions of the part of the second electrode 50 located in the second display area 102.

The preparing step may include a correcting step. The correcting step includes correcting, based on results of simulation or experimentation on diffracted light that is produced in the second display area 102, the types, amounts of displacement, ratios, dimensions, or other features of the aforementioned apertures 51.

Figure 18:
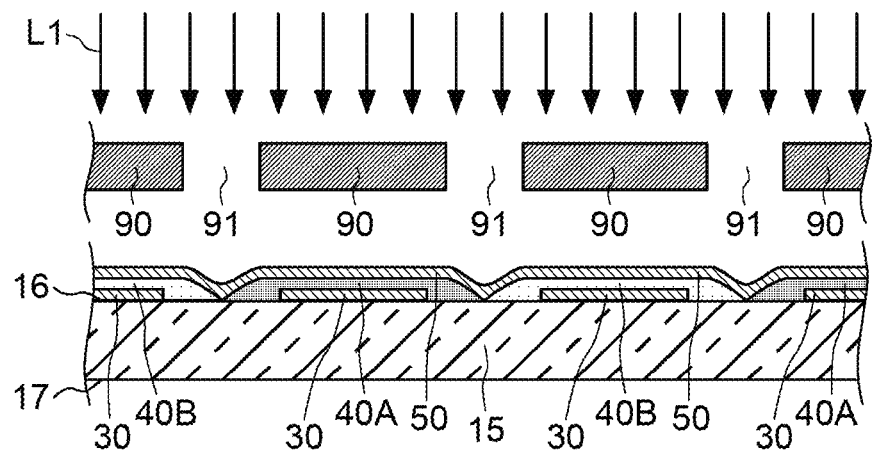
FIG. 18 is a cross-sectional view showing an example of a step of partially removing the second electrode.
Figure 19:
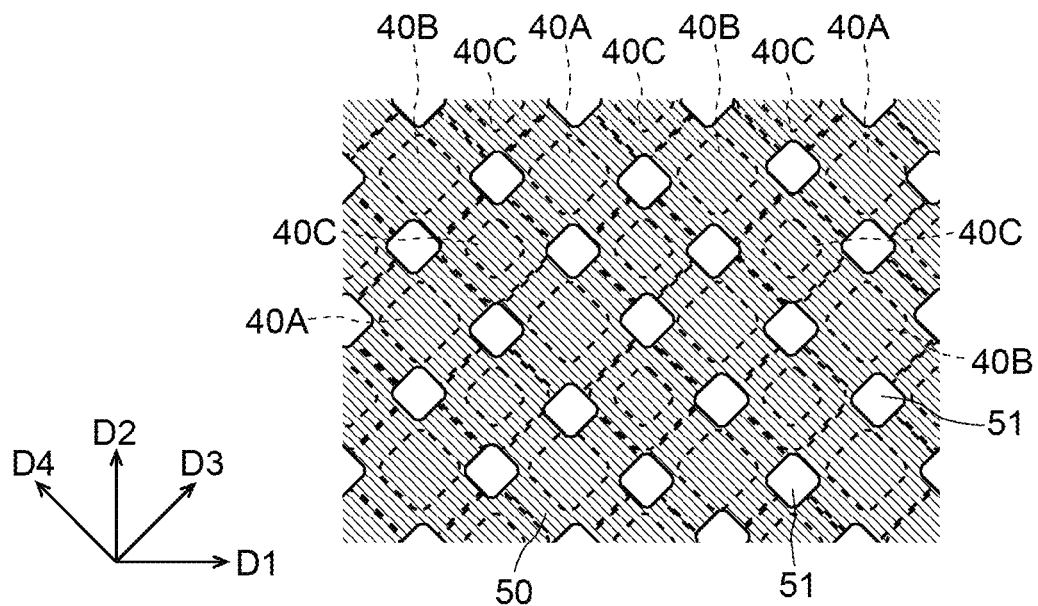
FIG. 19 is a cross-sectional view showing an example of a step of partially removing the second electrode.

The preparing step is followed by the removing step. The removing step includes partially removing the second electrode 50 and thereby forming the apertures 51. The removing step may include an irradiating step of irradiating the second electrode 50 with a laser L1 as shown in FIG. 18. The irradiating step may include a step of irradiating the second electrode 50 with the laser L1 via through holes 91 of a laser mask 90. By irradiating the second electrode 50 with the laser L1, the apertures 51 can be formed in the second electrode 50 as shown in FIG. 19. In this way, an electronic device 10 including a second electrode 50 including apertures 51 can be obtained.

The irradiating step may include a step of, after the apertures 51 have been formed in the second electrode 50, irradiating, with the laser L1, regions of the organic layers 40 that overlap the apertures 51. By irradiating the organic layers 40 with the laser L1, organic layer apertures 41 overlapping the apertures 51 can be formed in the organic layers 40.

In a case where the first organic layers 40A and the second organic layers 40B partially overlap each other as shown in FIG. 15 described above, the overlap portions 45 may be irradiated with the laser L1. This makes it possible to remove the overlap portions 45.

Figure 20:
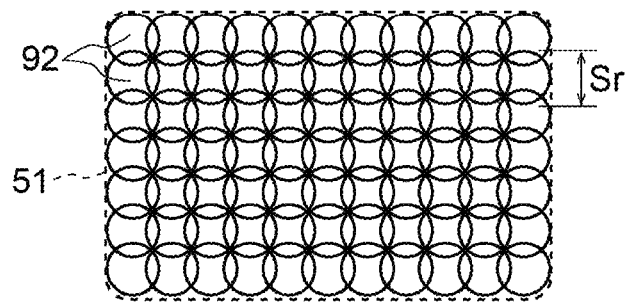
FIG. 20 is a diagram showing an example of a step of irradiating the second electrode with a laser.

FIG. 20 is a diagram showing an example of the irradiating step. In FIG. 20, a region in which the apertures 51 are to be formed is indicated by dotted lines. As shown in FIG. 20, spots 92 produced by a laser with which the second electrode 50 is irradiated may have spot diameters Sr that are smaller than the dimensions of the apertures 51. In this case, the region of the second electrodes 50 in which the apertures 51 are to be formed may be irradiated with the laser by passing a light source of the laser in the in-plane direction of the first surface 16 of the substrate 15 with the laser mask 90 interposed between the laser light source and the second electrode 50.

A usable example of the laser is a YAG laser. The YAG laser may be generated by a light source including an oscillating medium containing a crystal obtained by adding neodymium to yttrium, aluminum, and garnet. In this case, a laser with a wavelength of 1064 nm may be produced as a fundamental wave. Further, by passing the fundamental wave through a nonlinear optical crystal, a second harmonic with a wavelength of 532 nm may be produced. Further, by passing the fundamental wave and the second harmonic through the nonlinear optical crystal, a third harmonic with a wavelength of 355 nm may be produced. The laser with which the second electrode 50 is irradiated may include one, two, or three types of the fundamental wave, the second harmonic, and the third harmonic.

The laser with which the second electrode 50 is irradiated may be a laser other than the YAG laser.

Figure 21:
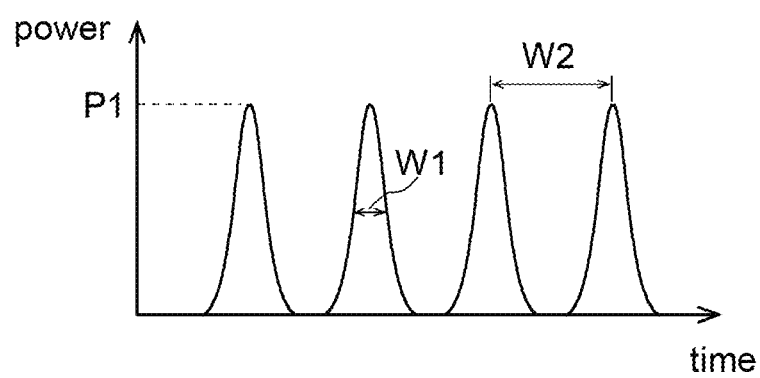
FIG. 21 is a diagram showing an example of a laser including pulses.

In the irradiating step, the second electrode 50 may be intermittently irradiated with pulses of the laser L1. That is, as the laser L1 with which the second electrode 50 is irradiated, not continuous light but a laser L1 including pulses obtained by pulse oscillation may be used. This makes it easy to control heat that is generated in the second electrode 50 due to irradiation with the laser L1. FIG. 21 is a diagram showing an example of a laser L1 including pulses. In FIG. 21, reference sign W1 denotes the pulse width of the laser L1, reference sign W2 the period of a pulse of the laser L1, and reference sign P1 the peak output of the laser L1. The pulse width W1 is the half-width of the peak of a pulse.

In the irradiating step, parameters such as the spot diameter Sr of the laser L1, the pulse width W1, the period W2 of a pulse, the peak output P1, and pulse energy may be appropriately adjusted. This makes it possible to adjust the extent to which the upper ends 53 of the side surfaces 52 of the second electrode 50 are raised. This also makes it possible to adjust the width u1 each of the side surfaces 42 of the organic layers 40.

The present embodiment makes it easy for light to be transmitted through the electronic device 10, as the second electrode 50 includes the apertures 51. This makes it possible to increase the overall transmittance of the electronic device 10. Further, by reducing regularity of an arrangement of the apertures 51, high-intensity diffracted light can be restrained from falling on an optical component such as a sensor. This makes it possible, for example, to reduce blurring of an image that is generated by the sensor.

Various changes may be made to the foregoing embodiment. The following describes other embodiments with reference to the drawings as needed. In the following description and the drawings to which the following description refers, components that may be configured in the same manner as in the foregoing embodiment are assigned the same reference signs as those assigned to the corresponding components in the foregoing embodiment, and a repeated description is omitted. In a case where it is clear that a working effect that is brought about by the foregoing embodiment can also be brought about by another embodiment, a description of the working effect may be omitted.

FIG. 22 is a plan view showing an example of an arrangement of the apertures 51 of the second electrode 50. The foregoing embodiment has illustrated an example in which the directions of displacement of the aperture center points 51C with respect to the unit region center points 57C are adjusted. FIG. 22 illustrates an example in which the dimensions of the apertures 51 are adjusted. In the example shown in FIG. 22, the aperture center points 51C of the plurality of apertures 51 may not be displaced with respect to the unit region center points 57C.

The plurality of apertures 51 may include a plurality of S1 apertures 51S1, a plurality of S2 apertures 51S2, and a plurality of S3 apertures 51S3. The dimension r of each of the S2 apertures 51S2 in planar view is larger than the dimension r of each of the S1 apertures 51S1 in planar view. The dimension r of each of the S3 apertures 51S3 in planar view is smaller than the dimension r of each of the S1 apertures 51S1 in planar view. The dimension r is the dimension of an aperture 51 in a direction in which the dimension of the aperture 51 reaches its maximum in planar view.

The dimension r of each of the S1 apertures 51S1 may be greater than or equal to "Average−TH3%" and less than or equal to "Average+TH3%". The average is the average of the dimensions of the part of the second electrode 50 located in the second display area 102. The dimension r of each of the S2 apertures 51S2 may be greater than "Average+TH3%". The dimension r of each of the S3 apertures 51S3 may be less than "Average−TH3%".

The dimension r of each of the apertures 51 is calculated, for example, by analyzing an image in the second display area 102 that is generated based on light reflected by the electronic device 10.

The threshold "TH3%" may for example be greater than or equal to 5%, greater than or equal to 10%, or greater than or equal to 15%. "TH3%" may for example be less than or equal to 20%, less than or equal to 25%, or less than or equal to 30%. "TH3%" may fall within a range defined by a first group consisting of 5%, 10%, and 15% and/or a second group consisting of 20%, 25%, and 30%. "TH3%" may fall within a range defined by a combination of any one of the values included in the aforementioned first group and any one of the values included in the aforementioned second group. "TH3%" may fall within a range defined by a combination of any two of the values included in the aforementioned first group. "TH3%" may fall within a range defined by a combination of any two of the values included in the aforementioned second group. "TH3%" may for example be greater than or equal to 5% and less than or equal to 30%, greater than or equal to 5% and less than or equal to 25%, greater than or equal to 5% and less than or equal to 20%, greater than or equal to 5% and less than or equal to 15%, greater than or equal to 5% and less than or equal to 10%, greater than or equal to 10% and less than or equal to 30%, greater than or equal to 10% and less than or equal to 25%, greater than or equal to 10% and less than or equal to 20%, greater than or equal to 10% and less than or equal to 15%, greater than or equal to 15% and less than or equal to 30%, greater than or equal to 15% and less than or equal to 25%, greater than or equal to 15% and less than or equal to 20%, greater than or equal to 20% and less than or equal to 30%, greater than or equal to 20% and less than or equal to 25%, or greater than or equal to 25% and less than or equal to 30%.

It is preferable that the ratios of the S1 to S3 apertures 51S1 to 51S3 be balanced. For example, it is preferable that a difference between a minimum S ratio R3 and a maximum S ratio R4 be small. The minimum S ratio R3 is the number of apertures that are smallest in number of the S1 to S3 apertures 51S1 to 51S3. The maximum S ratio R4 is the number of apertures that are largest in number of the S1 to S3 apertures 51S1 to 51S3.

R4/R3, which is the ratio of the maximum S ratio R4 to the minimum S ratio R3, may for example be higher than or equal to 1.00, higher than or equal to 1.10, higher than or equal to 1.20, or higher than or equal to 1.30. R4/R3 may for example be lower than or equal to 1.50, lower than or equal to 2.00, lower than or equal to 5.00, or lower than or equal to 10.0. R4/R3 may fall within a range defined by a first group consisting of 1.00, 1.10, 1.20, and 1.30 and/or a second group consisting of 1.50, 2.00, 5.00, and 10.0. R4/R3 may fall within a range defined by a combination of any one of the values included in the aforementioned first group and any one of the values included in the aforementioned second group. R4/R3 may fall within a range defined by a combination of any two of the values included in the aforementioned first group. R4/R3 may fall within a range defined by a combination of any two of the values included in the aforementioned second group. R4/R3 may for example be higher than or equal to 1.00 and lower than or equal to 10.0, higher than or equal to 1.00 and lower than or equal to 5.00, higher than or equal to 1.00 and lower than or equal to 2.00, higher than or equal to 1.00 and lower than or equal to 1.50, higher than or equal to 1.00 and lower than or equal to 1.30, higher than or equal to 1.00 and lower than or equal to 1.20, higher than or equal to 1.00 and lower than or equal to 1.10, higher than or equal to 1.10 and lower than or equal to 10.0, higher than or equal to 1.10 and lower than or equal to 5.00, higher than or equal to 1.10 and lower than or equal to 2.00, higher than or equal to 1.10 and lower than or equal to 1.50, higher than or equal to 1.10 and lower than or equal to 1.30, higher than or equal to 1.10 and lower than or equal to 1.20, higher than or equal to 1.20 and lower than or equal to 10.0, higher than or equal to 1.20 and lower than or equal to 5.00, higher than or equal to 1.20 and lower than or equal to 2.00, higher than or equal to 1.20 and lower than or equal to 1.50, higher than or equal to 1.20 and lower than or equal to 1.30, higher than or equal to 1.30 and lower than or equal to 10.0, higher than or equal to 1.30 and lower than or equal to 5.00, higher than or equal to 1.30 and lower than or equal to 2.00, higher than or equal to 1.30 and lower than or equal to 1.50, higher than or equal to 1.50 and lower than or equal to 10.0, higher than or equal to 1.50 and lower than or equal to 5.00, higher than or equal to 1.50 and lower than or equal to 2.00, higher than or equal to 2.00 and lower than or equal to 10.0, higher than or equal to 2.00 and lower than or equal to 5.00, or higher than or equal to 5.00 and lower than or equal to 10.0.

The numbers of S1 to S3 apertures 51S1 to 51S3 may be measured all over the second display area 102. In a case where the second display area 102 is wide, the numbers of S1 to S3 apertures 51S1 to 51S3 may be measured in part of the second display area 102. For example, in a case where a region to be inspected can bs set in part of the second display area 102, the numbers of S1 to S3 apertures 51S1 to 51S3 may be measured in the region to be inspected. The region to be inspected is a region having the shape of a square, 2 mm on a side.

As is the case with the foregoing embodiment, the example shown in FIG. 22 too makes it possible to reduce the regularity of the arrangement of the apertures 51. This makes it possible to restrain high-intensity diffracted light from falling on an optical component such as a sensor. This makes it possible, for example, to reduce blurring of an image that is generated by the sensor.

FIG. 23 is a plan view showing an example of an arrangement of the apertures 51 of the second electrode 50. The second display area 102 may include apertures 51 with adjusted directions of displacement of the aperture center points 51C with respect to the unit region center points 57C and with adjusted dimensions r. For example, the plurality of apertures 51 may include a plurality of apertures 51PmSn. m is an integer of 1 or greater and 9 or less. n is an integer of 1 or greater and 3 or less. For example, apertures 51P8S3 are apertures 51 falling under the category of P8 apertures 51P8 and falling under the category of S3 apertures S3. For example, apertures 51P7S1 are apertures 51 falling under the category of P7 apertures 51P7 and falling under the category of S1 apertures 51S1. For example, apertures 51P3S2 are apertures 51 falling under the category of P3 apertures 51P3 and falling under the category of S2 apertures S2.

The example shown in FIG. 23 makes it possible to more precisely adjust diffracted light by adjusting the directions of displacement of the aperture center points 51C with respect to the unit region center points 57C and adjusting the dimensions r.

The plurality of apertures 51 may include a plurality of D11S1 apertures, a plurality of D11S2 apertures, a plurality of D11S3 apertures, a plurality of D12S1 apertures, a plurality of D12S2 apertures, and a plurality of D12S3 apertures.

The D11S1 apertures are apertures 51 falling under the category of D11 apertures and falling under the category of S1 apertures.

The D11S2 apertures are apertures 51 falling under the category of D11 apertures and falling under the category of S2 apertures.

The D11S3 apertures are apertures 51 falling under the category of D11 apertures and falling under the category of S3 apertures.

The D12S1 apertures are apertures 51 falling under the category of D12 apertures and falling under the category of S1 apertures.

The D12S2 apertures are apertures 51 falling under the category of D12 apertures and falling under the category of S2 apertures.

The D12S3 apertures are apertures 51 falling under the category of D12 apertures and falling under the category of S3 apertures.

The plurality of apertures 51 may include a plurality of D21S1 apertures, a plurality of D21S2 apertures, a plurality of D21S3 apertures, a plurality of D22S1 apertures, a plurality of D22S2 apertures, and a plurality of D22S3 apertures.

The D21S1 apertures are apertures 51 falling under the category of D21 apertures and falling under the category of S1 apertures.

The D21S2 apertures are apertures 51 falling under the category of D21 apertures and falling under the category of S2 apertures.

The D21S3 apertures are apertures 51 falling under the category of D21 apertures and falling under the category of S3 apertures.

The D22S1 apertures are apertures 51 falling under the category of D22 apertures and falling under the category of S1 apertures.

The D22S2 apertures are apertures 51 falling under the category of D22 apertures and falling under the category of S2 apertures.

The D22S3 apertures are apertures 51 falling under the category of D22 apertures and falling under the category of S3 apertures.

The aperture center point 51C of an aperture 51 may be displaced toward the D11 side or the D12 side with respect to a unit region center point 57C and be further displaced toward the D21 side or the D22 side with respect to the unit region center point 57C. Accordingly, the plurality of apertures 51 may include apertures 51 falling under the category of D11S1 apertures or D12S1 apertures and further falling under the category of D21S1 apertures or D22S1 apertures. Further, the plurality of apertures 51 may include apertures 51 falling under the category of D11S2 apertures or D12S2 apertures and further falling under the category of D21S2 apertures or D22S2 apertures. Further, the plurality of apertures 51 may include apertures 51 falling under the category of D11S3 apertures or D12S3 apertures and further falling under the category of D21S3 apertures or D22S3 apertures. The aforementioned apertures 51P8S3 are apertures 51 falling under the category of D11S3 apertures and further falling under the category of D22S3 apertures.

FIG. 24 is a plan view showing examples of the first display area 101 and the second display area 102. The first display area 101 may include a plurality of elements 20 arranged at eleventh pitches P11 along the first direction D1 and arranged at twenty-first pitches P21 along the second direction D2. The first display area 101 may include a plurality of elements 20 arranged at twelfth pitches P12 along the first direction D1 and arranged at twenty-second pitches P22 along the second direction D2. The twelfth pitches P12 may be greater than the eleventh pitches P11. The twenty-first pitches P21 may be greater than the twenty-second pitches P22.

P12/P11, which is the ratio of a twelfth pitch P12 to an eleventh pitch P11, may for example be higher than or equal to 1.0, higher than or equal to 1.3, or higher than or equal to 1.5. P12/P11 may for example be lower than or equal to 2.0, lower than or equal to 3.0, or lower than or equal to 4.0. P12/P11 may fall within a range defined by a first group consisting of 1.0, 1.3, and 1.5 and/or a second group consisting of 2.0, 3.0, and 4.0. P12/P11 may fall within a range defined by a combination of any one of the values included in the aforementioned first group and any one of the values included in the aforementioned second group. P12/P11 may fall within a range defined by a combination of any two of the values included in the aforementioned first group. P12/P11 may fall within a range defined by a combination of any two of the values included in the aforementioned second group. P12/P11 may for example be higher than or equal to 1.0 and lower than or equal to 4.0, higher than or equal to 1.0 and lower than or equal to 3.0, higher than or equal to 1.0 and lower than or equal to 2.0, higher than or equal to 1.0 and lower than or equal to 1.5, higher than or equal to 1.0 and lower than or equal to 1,3, higher than or equal to 1.3 and lower than or equal to 4.0, higher than or equal to 1.3 and lower than or equal to 3.0, higher than or equal to 1.3 and lower than or equal to 2.0, higher than or equal to 1.3 and lower than or equal to 1.5, higher than or equal to 1.5 and lower than or equal to 4.0, higher than or equal to 1.5 and lower than or equal to 3.0, higher than or equal to 1.5 and lower than or equal to 2.0, higher than or equal to 2.0 and lower than or equal to 4.0, higher than or equal to 2.0 and lower than or equal to 3.0, or higher than or equal to 3.0 and lower than or equal to 4.0.

As the range of numerical values of P22/P21, which is the ratio of a twenty-second pitch P22 to a twenty-first pitch P21, the aforementioned range of numerical values of P12/P11 may be employed.

Figure 25:
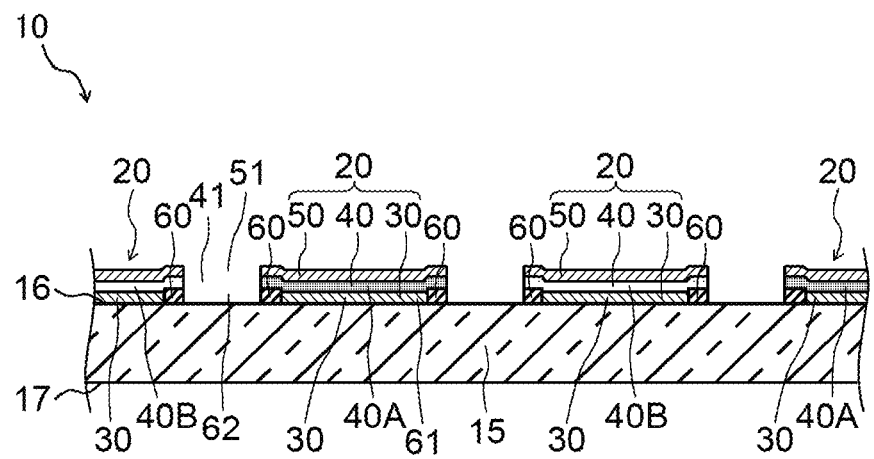
FIG. 25 is a cross-sectional view showing an example of an electronic device according to an embodiment of the present disclosure.
Figure 26A:
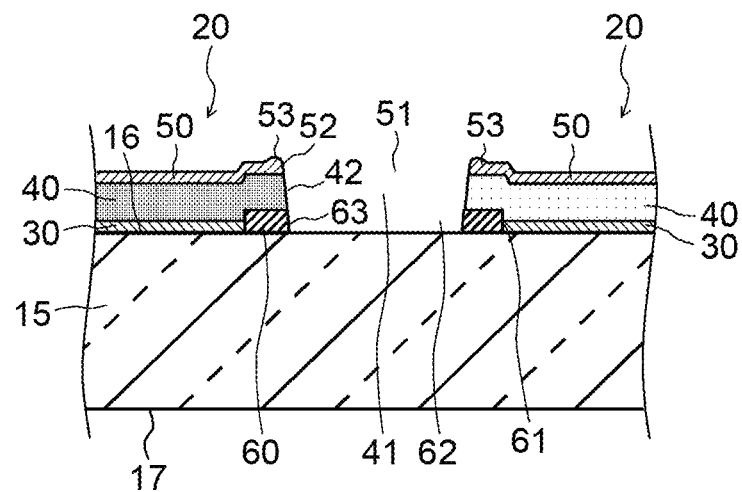
FIG. 26A is a further enlarged cross-sectional view of elements of the electronic device of FIG. 17.

An electronic device 10 according to another embodiment of the present disclosure and a manufacturing method for the electronic device 10 are described with reference to FIGS. 25 to 31. FIG. 25 is a cross-sectional view showing an example of an electronic device 10. Further, FIG. 26A is an enlarged cross-sectional view of the electronic device 10 of FIG. 25. The electronic device 10 may include an insulating layer 60 located between the first surface 16 of the substrate 15 and the organic layers 40 in the direction normal to the first surface 16. The insulating layer 60 may include insulating layer first apertures 61. The first electrodes 30 may be located in the insulating layer first apertures 61 in planar view. Although not illustrated, parts of the first electrodes 30 may be located between the insulating layer 60 and the first surface 16 of the substrate 15.

Further, the insulating layer 60 may include insulating layer second apertures 62. The insulating layer second apertures 62 may overlap the apertures 51 of the second electrode 50 in planar view. Further, the insulating layer second apertures 62 may overlap the organic layer apertures 41 of the organic layers 40. The insulating layer 60 includes sides surfaces 63 facing the insulating layer second apertures 62. As shown in FIG. 26A, upper ends of the side surfaces 63 of the organic layers 60 may be in contact with lower ends of the side surfaces 42 of the organic layers 40. Such a relationship between the side surfaces 63 and the side surfaces 42 can be achieved in a case where the organic layer apertures 41 and the insulating layer second apertures 62 are formed by laser processing.

The insulating layer 60 contains a material having insulation properties. For example, the insulating layer 60 may contain a resin material such as polyimide resin.

Next, an example of a manufacturing method for the electronic device 10 shown in FIG. 25 is described.

Figure 27:
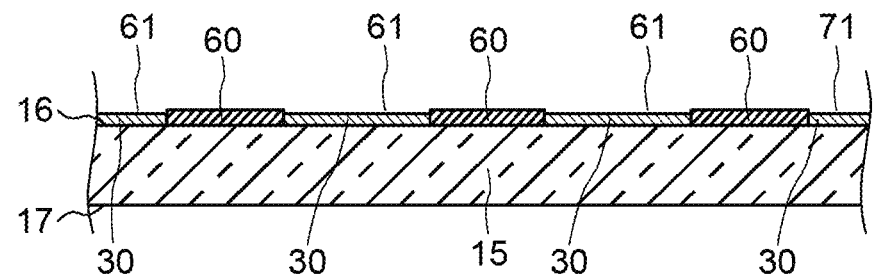
FIG. 27 is a cross-sectional view showing an example of a substrate with an insulating layer and first electrodes formed thereon.
Figure 28:
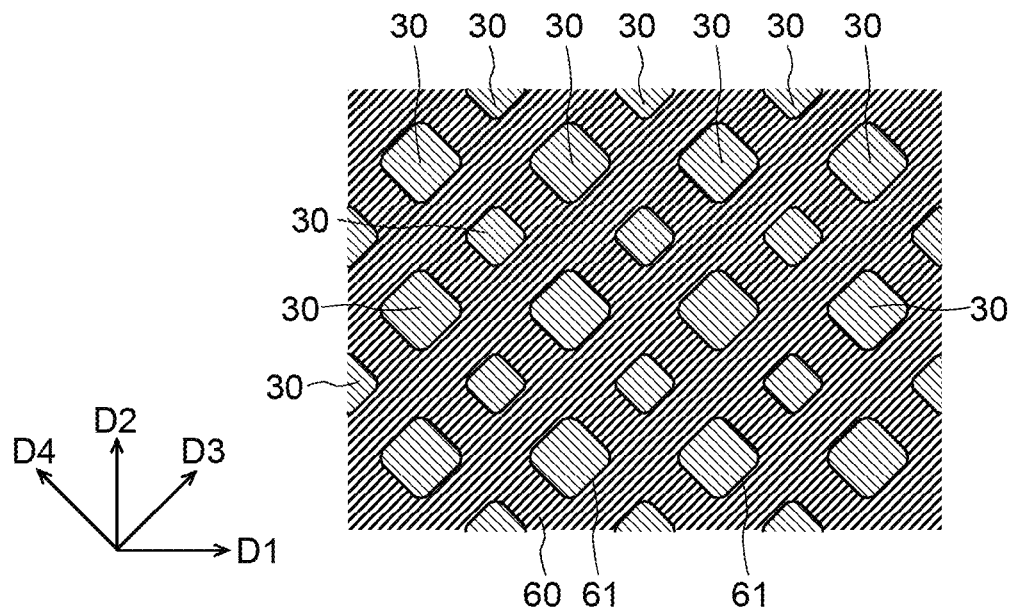
FIG. 28 is a cross-sectional view showing an example of a substrate with an insulating layer and first electrodes formed thereon.

First, as in the case of the foregoing embodiment shown in FIGS. 9 and 10, a substrate 15 with first electrodes 30 formed thereon is prepared. Then, an insulating layer forming step of forming, on the first surface 16 of the substrate 15, an insulating layer 60 having insulating layer first apertures 61. FIGS. 27 and 28 are a cross-sectional view and a plan view, respectively, showing an example of the substrate 15 with the first electrodes 30 and the insulating layer 60 formed thereon.

In the insulating layer forming step, for example, first, the insulating layer 60 is formed all over the first surface 16 of the substrate 15 by applying a solution containing the material of the insulating layer 60 onto the first surface 16 and drying the solution. Then, the insulating layer first apertures 61 are formed in the insulating layer 60 by exposing and developing the insulating layer 60. In this way, the insulating layer 60 can be formed between the first electrodes 30.

Figure 29:
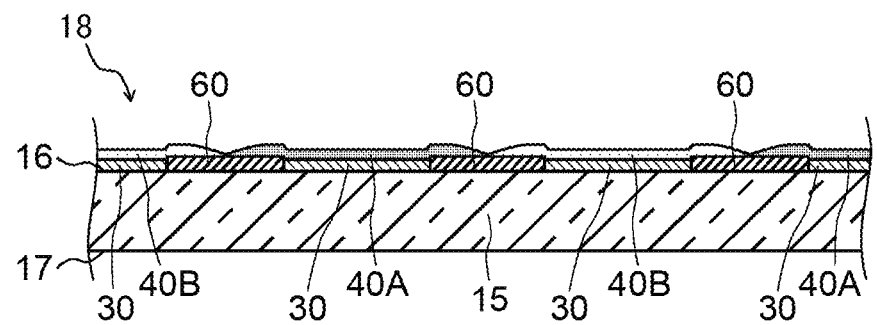
FIG. 29 is a plan view showing an example of a substrate with an insulating layer, first electrodes, and organic layers formed thereon.

Then, as shown in FIG. 29, an organic layer forming step of forming organic layers 40 on top of the first electrodes 30 is executed. The organic layers 40 may be formed so as to overlap the first electrodes 30 and the insulating layer 60 in planar view. In this way, a layered product 18 including a substrate 15, two or more first electrodes 30 located on the first surface 16 of the substrate 15, an insulating layer 60 located between the first electrodes 30, and organic layers 40 located on top of the first electrodes 30 can be prepared.

Figure 30:
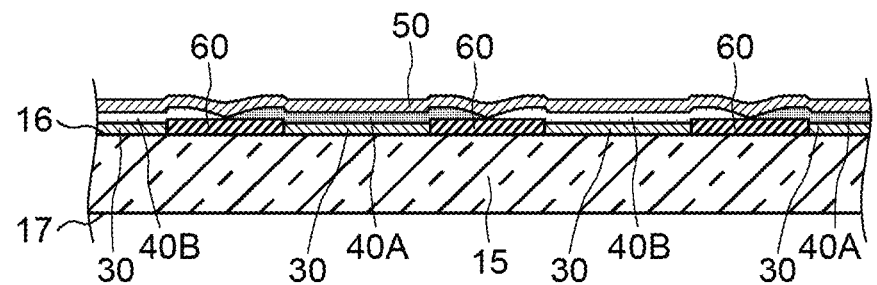
FIG. 30 is a cross-sectional view showing an example of a step of forming a second electrode.

Then, as shown in FIG. 30, a second electrode forming step of forming a second electrode 50 is executed. In the second electrode forming step, as in the case of the foregoing embodiment shown in FIGS. 9 and 10, the second electrode 50 is formed on top of the organic layers 40 so as to overlap two or more of the first electrodes 30 in planar view.

Figure 31:
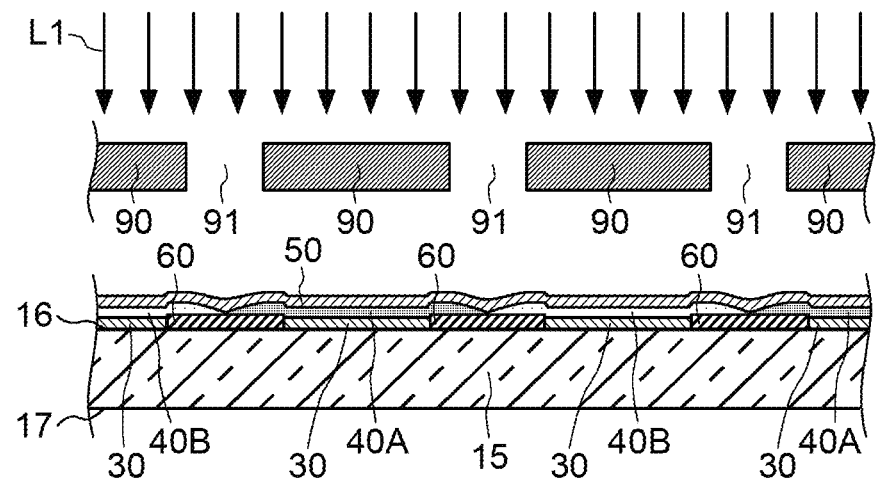
FIG. 31 is a cross-sectional view showing an example of a step of partially removing the second electrode.

Then, as shown in FIG. 31, a removing step of partially removing the second electrode 50 and thereby forming apertures 51 is executed. As shown in FIG. 31, the removing step may include forming the apertures 51 by partially removing a region of the second electrode 50 that overlaps the insulating layer 60 in planar view. The removing step may include an irradiating step of irradiating the second electrode 50 with a laser L1 as shown in FIG. 31. By irradiating the second electrode 50 with the laser L1, the apertures 51 can be formed in the second electrode 50 as shown in FIG. 25 described above. In this way, an electronic device 10 including a second electrode 50 including apertures 51 can be obtained.

The irradiating step may include a step of, after the apertures 51 have been formed in the second electrode 50, irradiating, with the laser L1, regions of the organic layers 40 that overlap the apertures 51. By irradiating the organic layers 40 with the laser L1, organic layer apertures 41 overlapping the apertures 51 can be formed in the organic layers 40 as shown in FIG. 25 described above.

Further, the irradiating step may include a step of, after the organic layer apertures 41 have been formed in the organic layers 40, irradiating, with the laser L1, regions of the insulating layer 60 that overlap the organic layer apertures 41. By irradiating the insulating layer 60 with the laser L1, insulating layer second apertures 62 overlapping the apertures 51 and the organic layer apertures 41 can be formed in the insulating layer 60 as shown in FIG. 25 described above.

Figure 26B:
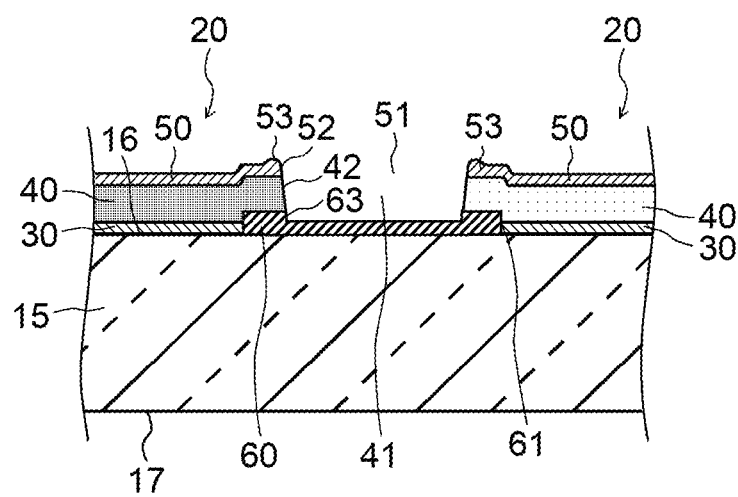
FIG. 26B is a cross-sectional view of examples of elements of the electronic device of FIG. 17.

In the organic layer apertures 41, the first surface 16 of the substrate 15 may be exposed or may not be exposed. The term "exposed" here means that no layer is formed on the first surface 16. The term "not exposed" means that some sort of layer is formed on the first surface 16. For example, as shown in FIG. 26B, in the organic layer apertures 41, the insulating layer 60 may be located on the first surface 16 of the substrate 15. The thickness of a portion of the insulating layer 60 located in an organic layer aperture 41 in planar view may be smaller than the thickness of a portion of the insulating layer 60 that overlaps an organic layer 40 in planar view. Such an insulating layer 60 is produced, for example, by partially removing the insulating layer 60 in a direction parallel with the thickness of the insulating layer 60 in the step of irradiating, with the laser L1, the regions of the insulating layer 60 that overlap the organic layer apertures 41. Leaving the insulating layer 60 in the organic layer apertures 41 makes it possible to restrain two of the first electrodes 30 adjacent to each other across an organic layer aperture 41 in planar view from being electrically connected to each other.

Although not illustrated, in the insulating layer second apertures 62, a layer having insulation properties and differing from the insulating layer 60 may be located on the first surface 16 of the substrate 15. This makes it possible to restrain two of the first electrodes 30 adjacent to each other across an insulating layer second aperture 62 in planar view from being electrically connected to each other.

An electronic device 10 according to another embodiment of the present disclosure is described with reference to FIG. 32A. The electronic device 10 may include a protective layer 70 overlapping the second electrode 50 and the apertures 51 in planar view.

The protective layer 70 contains a material having insulation properties and transparency. The material of the protective layer 70 may be an organic material, or may be an inorganic material. For example, the protective layer 70 may contain a resin material such as polyimide resin, acrylic resin, or epoxy resin. For example, the protective layer 70 may contain an inorganic material. The inorganic material may be an inorganic nitride such as silicon nitride, or may be an inorganic oxide such as silicon oxide or aluminum oxide. The protective layer 70 may include two or more layers composed of these materials and joined on top of each other in the direction parallel with the thickness of the substrate 15.

Figure 32A:
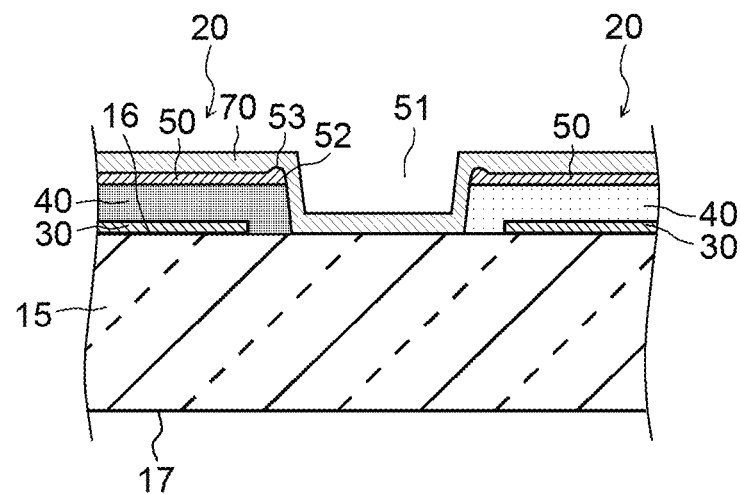
FIG. 32A is a cross-sectional view showing an example of an electronic device according to an embodiment of the present disclosure.

In a case where, as shown in FIG. 32A, upper ends 53 of the side surfaces 52 of the second electrode 50 are raised above surrounding parts of the second electrode 50, the upper ends 53 of the side surfaces 52 of the second electrode 50 can penetrate into the protective layer 70. This leads to an increase in area of contact between the second electrode 50 and the protective layer 70. This makes it possible to restrain the protective layer 70 from coming off the second electrode 50.

As shown in FIG. 32A, the protective layer 70 may cover side surfaces of the organic layers 40. The protective layer 70 can restrain water vapor, oxygen, or other substances in the atmosphere from penetrating into the organic layers 40. This makes it possible to reduce deterioration of the organic layers 40.

The protective layer 70 may spread along cross-sectional shapes of the organic layers 40. For example, as shown in FIG. 32A, a surface of a portion of the protective layer 70 that overlaps an aperture 51 may be located between a surface of a portion of the second electrode 50 that overlaps a first electrode 30 and the first surface 16 in the direction parallel with the thickness of the substrate 15.

Figure 32B:
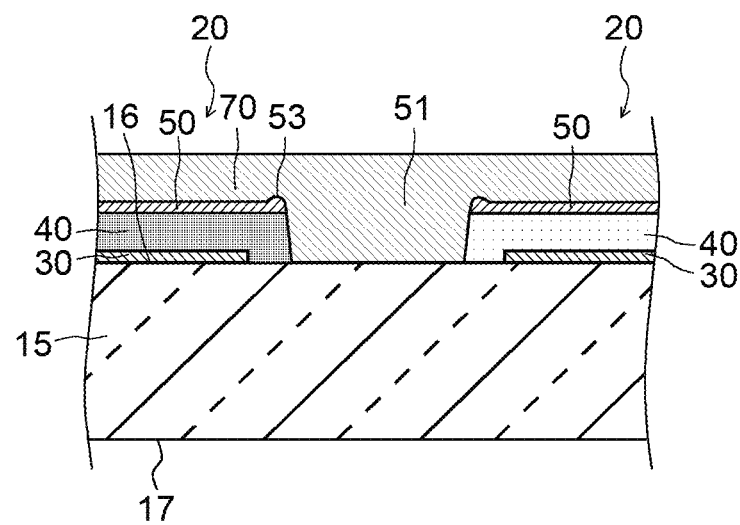
FIG. 32B is a cross-sectional view showing an example of an electronic device according to an embodiment of the present disclosure.

The protective layer 70 may have a thickness that is greater than the total of the thicknesses of a first electrode 30, an organic layer 40, and the second electrode 50. For example, as shown in FIG. 32B, a surface of a portion of the second electrode 50 that overlaps a first electrode 30 may be located between a surface of a portion of the protective layer 70 that overlaps an aperture 51 and the first surface 16 in the direction parallel with the thickness of the substrate 15.

A step of forming the protective layer 70 may include a step of applying a liquid containing the material of the protective layer 70 to the second electrode 50 and the apertures 51. The protective layer 70 may be formed by another method.

An electronic device 10 according to another embodiment of the present disclosure and a manufacturing method for the electronic device 10 are described with reference to FIGS. 33 to 35B. The foregoing embodiment has illustrated an example in which the apertures 51 are formed by removing portions of the second electrode 50 located on top of the organic layers 40. An example is described here in which the apertures 51 are formed by removing a region of the second electrode 50 that does not overlap the organic layers 40 in planar view.

Figure 33:
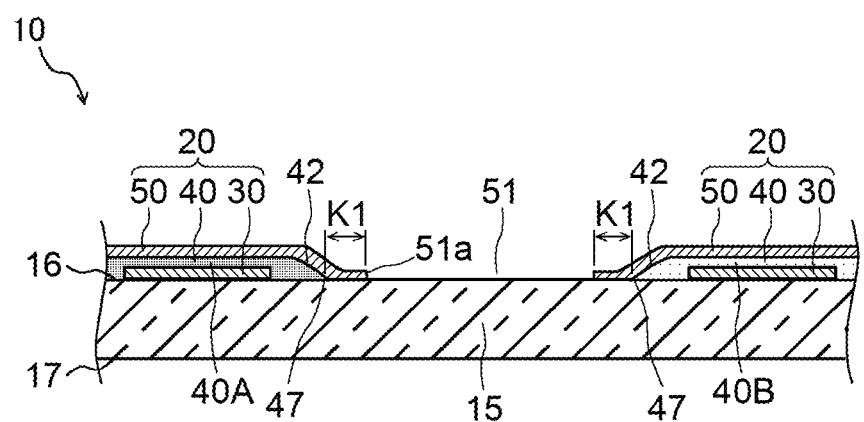
FIG. 33 is a cross-sectional view showing an example of an electronic device according to an embodiment of the present disclosure.

FIG. 33 is a cross-sectional view showing an example of an electronic device 10 according to the present embodiment. As shown in FIG. 33, the organic layers 40 may not face the apertures 51 of the second electrode 50, and ends 47 of the organic layers 40 may overlap the second electrode 50.

Next, an example of a manufacturing method for the electronic device 10 shown in FIG. 33 is described.

Figure 34:
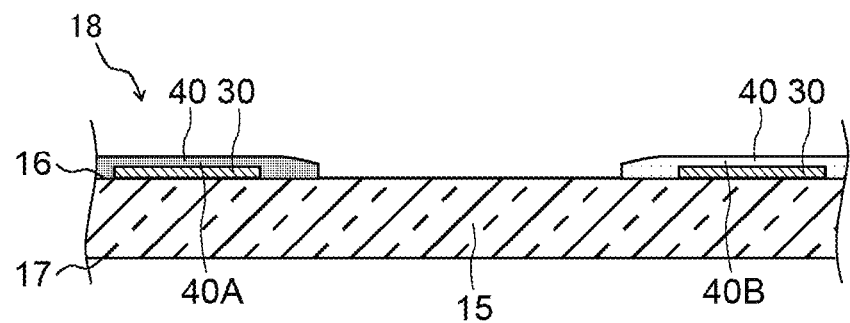
FIG. 34 is a cross-sectional view showing an example of a substrate with an insulating layer and first electrodes formed thereon.

First, as in the case of the foregoing embodiment shown in FIGS. 9 and 10, a substrate 15 with first electrodes 30 formed thereon is prepared. Then, as shown in FIG. 34, an organic layer forming step of forming organic layers 40 on top of the first electrodes 30 is executed. As shown in FIG. 34, a gap in which no organic layer 40 is present may be interposed between adjacent two of the organic layers 40 in planar view.

Figure 35A:
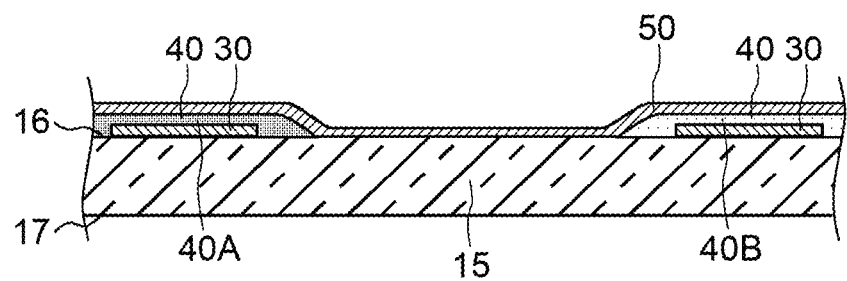
FIG. 35A is a cross-sectional view showing an example of a step of forming a second electrode.

Then, as shown in FIG. 35A, a second electrode forming step of forming a second electrode 50 is executed. In the second electrode forming step, as in the case of the foregoing embodiment shown in FIGS. 9 and 10, the second electrode 50 is formed on top of the organic layers 40 and on the first surface 16 of the substrate 15 so that the second electrode 50 overlaps two or more of the first electrodes 30 in planar view.

Figure 35B:
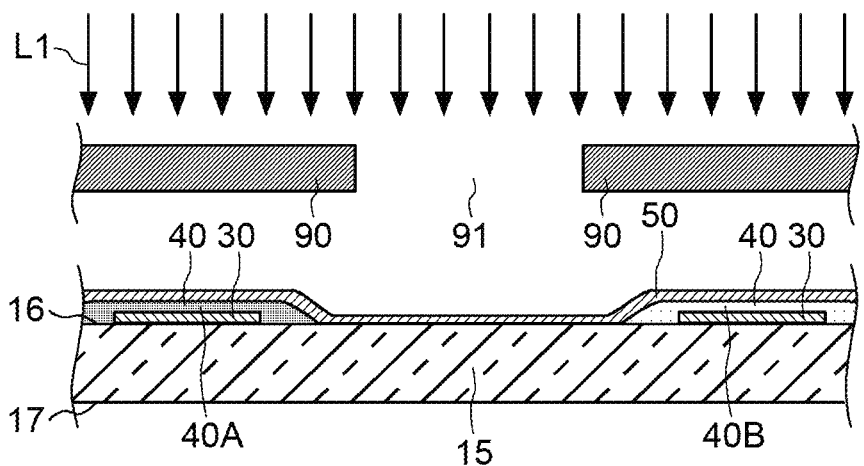
FIG. 35B is a cross-sectional view showing an example of a step of partially removing the second electrode.

Then, as shown in FIG. 35B, a removing step of partially removing a region of the second electrode 50 that does not overlap the first electrodes 30 in planar view and thereby forming the apertures 51 is executed. As shown in FIG. 28, the removing step may include partially removing a region of the second electrode 50 that does not overlap the organic layers 40 and thereby forming the apertures 51. The removing step may include an irradiating step of irradiating the second electrode 51 with a laser L1 as shown in FIG. 35B. By irradiating the second electrode 50 with the laser L1, the apertures 51 can be formed in the second electrode 50 as shown in FIG. 33 described above. In this way, an electronic device 10 including a second electrode 50 including apertures 51 can be obtained.

Reference sign K1 denotes the distance in planar view from the outer edge 51*a* of each of the apertures 51 to the corresponding one of the ends 47 of the organic layers 40. The distance K1 may for example be greater than or equal to 0.1 µm, greater than or equal to 0.5 µm, or greater than or equal to 1.0 µm. The distance K1 may for example be less than or equal to 2.0 µm, less than or equal to 4.0 µm, or less than or equal to 8.0 µm. The distance K1 may fall within a range defined by a first group consisting of 0.1 µm, 0.5 µm, and 1.0 µm and/or a second group consisting of 2.0 µm, 4.0 µm, and 8.0 µm. The distance K1 may fall within a range defined by a combination of any one of the values included in the aforementioned first group and any one of the values included in the aforementioned second group. The distance K1 may fall within a range defined by a combination of any two of the values included in the aforementioned first group. The distance K1 may fall within a range defined by a combination of any two of the values included in the aforementioned second group. The distance K1 may for example be greater than or equal to 0.1 µm and less than or equal to 8.0 µm, greater than or equal to 0.1 µm and less than or equal to 4.0 µm, greater than or equal to 0.1 µm and less than or equal to 2.0 µm, greater than or equal to 0.1 µm and less than or equal to 1.0 µm, greater than or equal to 0.1 µm and less than or equal to 0.5 µm, greater than or equal to 0.5 µm and less than or equal to 8.0 µm, greater than or equal to 0.5 µm and less than or equal to 4.0 µm, greater than or equal to 0.5 µm and less than or equal to 2.0 µm, greater than or equal to 0.5 µm and less than or equal to 1.0 µm, greater than or equal to 1.0 µm and less than or equal to 8.0 µm, greater than or equal to 1.0 µm and less than or equal to 4.0 µm, greater than or equal to 1.0 µm and less than or equal to 2.0 µm, greater than or equal to 2.0 µm and less than or equal to 8.0 µm, greater than or equal to 2.0 µm and less than or equal to 4.0 µm, or greater than or equal to 4.0 µm and less than or equal to 8.0 µm.

A manufacturing method for an electronic device 10 according to another embodiment of the present disclosure is described with reference to FIGS. 36A and 36B. The foregoing embodiment has illustrated an example in which the apertures 51 are formed by removing the second electrode 50. An example is described here in which inhibiting layers are formed on top of the substrate 15 before the step of forming the second electrode 50. The inhibiting layers have such properties that it is hard for the electrically conducting material constituting the second electrode 50 to adhere to the inhibiting layers.

Figure 36A:
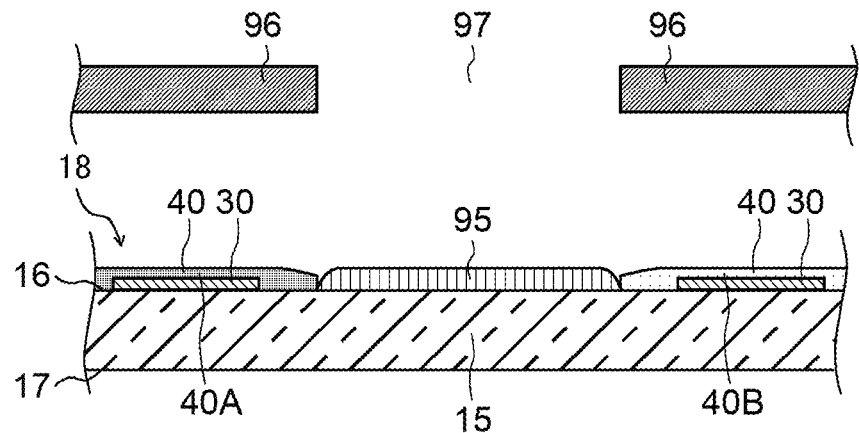
FIG. 36A is a cross-sectional view showing an example of a step of forming inhibiting layers.

FIG. 36A is a cross-sectional view showing an example of an inhibiting layer forming step of forming inhibiting layers 95. The inhibiting layer forming step is executed after the step of forming the organic layers 40 and before the step of forming the second electrode 50.

The inhibiting layer forming step may include a step of depositing a material of the inhibiting layers 95 on the substrate 15 via a mask 96. As shown in FIG. 36A, the inhibiting layers 95 are formed in regions of the substrate 15 that overlap through holes 97 of the mask 96. A pattern of the through holes 97 of the mask 96 correspond to a pattern of the apertures 51. That is, the shapes and arrangement of the through holes 97 of the mask 96 are set in accordance with the shapes and arrangement of the apertures 51 as calculated in the aforementioned preparing step.

Figure 36B:
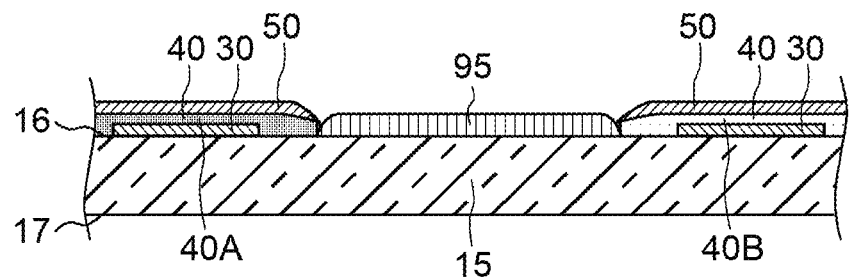
FIG. 36B is a cross-sectional view showing an example of a step of forming a second electrode.

FIG. 36B is a cross-sectional view showing an example of the step of forming the second electrode 50. The second electrode 50 is formed by depositing the material of the second electrode 50 on the substrate 15. As mentioned above, the inhibiting layers 95 have such properties that it is hard for the electrically conducting material constituting the second electrode 50 to adhere to the inhibiting layers 95. As shown in FIG. 36B, the second electrode 50 can be restrained from being formed on top of the inhibiting layers 95. For this reason, the regions in which the inhibiting layers 95 are formed can function as the apertures 51.

The inhibiting layers 95 have transparency. For example, it is preferable that the transmittance of a layered product including the substrate 15 and the inhibiting layers 95 be higher than or equal to 70% or, more preferably, higher than or equal to 80%. The transmittance of the layered product including the substrate 15 and the inhibiting layers 95 can be measured in conformity with ° Plastics—Determination of the total luminous transmittance of transparent materials" provided for in JIS K7361-1.

The material of the inhibiting layers 95 may be a material of a nucleation inhibiting coating described in WO 2017072678 A1 or WO 2019150327 A1. For example, the material of the inhibiting layers 95 may contain an organic material such as a low-molecular organic material and an organic polymer. The organic material may for example be a polycyclic aromatic compound. The polycyclic aromatic compound contains organic molecules each including a core portion and at least one terminal portion bonded to the core portion. Each of the organic molecules may contain one or more heteroatoms of nitrogen, sulfur, oxygen, phosphorus, aluminum, or other substances. The number of terminal portions may be larger than or equal to 1, larger than or equal to 2, larger than or equal to 3, or larger than or equal to 4. In a case where each of the organic molecules contains two or more terminal portions, the two or more terminal portions may be identical to or different from each other.

The terminal portion may include a biphenylyl portion represented by any of the following chemical structures (I-a), (I-b), and (I-c):

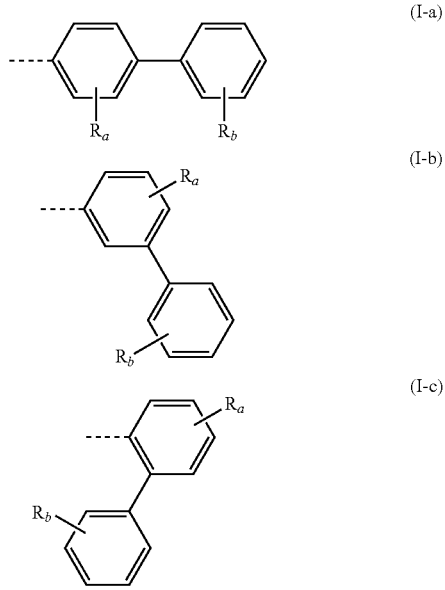

The substituents Ra and Rb may each independently be selected from among heavy hydrogen, fluorine, alkyl including $C_1$ to $C_4$ alkyl, cycloalkyl, arylalkyl, silyl, aryl, heteroaryl, fluoroalkyl, and any combination thereof.

EXAMPLES

Next, the embodiment of the present disclosure is described in more concrete terms with reference to examples. However, the embodiment of the present disclosure is not limited to the following description of the examples, provided the embodiment of the present disclosure does not depart from the scope of the embodiment of the present disclosure.

Diffraction of light having passed through second electrodes 50 of Examples 1 to 4 was verified by simulation.

Example 1

Figure 37:
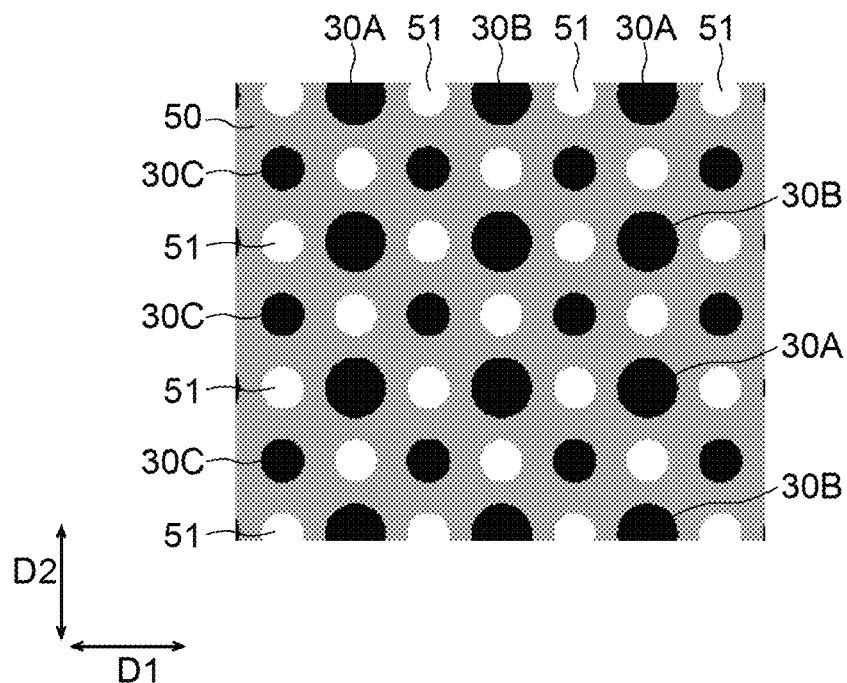
FIG. 37 is a plan view showing an example of an arrangement of apertures of a second electrode in Example 1.

An electronic device including first electrodes 30 and a second electrode 50 shown in FIG. 37 was designed. The first electrodes 30 include a plurality of A1 electrodes 30A, a plurality of A2 electrodes 30B, and a plurality of A3 electrodes 30C. The A1 electrodes 30A and the A2 electrodes 30B are arranged at regular pitches in the first direction D1 and the second direction D2. The A3 electrodes 30C are arranged at regular pitches in the first direction D1 and the second direction D2. The pitch between first electrodes 30 in the first direction D1 and the second direction D2 is 84.7 µm.

The shapes of the first electrodes 30 in planar view are circles. The diameter of each of the A1 electrodes 30A and the diameter of each of the A2 electrodes 30B are 34.1 µm. The diameter of each of the A3 electrodes 30C is 24.2 µm.

All of the apertures 51 fall under the category of the aforementioned P9 apertures 51P9. That is, the apertures 51 shown in FIG. 37 are regularly arranged. The shapes of the apertures 51 in planar view are circles. The diameter of each of the apertures 51 is 23 µm.

Example 2

An electronic device including first electrodes 30 and a second electrode 50 shown in FIG. 38 was designed in the same manner as in the case of Example 1 except that the plurality of apertures 51 includes the aforementioned P1 to P9 apertures 51P1 to 51P9. The amount of displacement Δ1 in the first direction D1 is 5 µm. The amount of displacement 12 in the second direction D2 is 5 µm. The ratios of the P1 to P9 apertures 51P1 to 51P9 are shown in Table 1.

TABLE 1

| Type | Ratio |
|---|---|
| P1 aperture 51P1 | 11.0% |
| P2 aperture 51P2 | 10.2% |
| P3 aperture 51P3 | 11.7% |
| P4 aperture 51P4 | 11.4% |
| P5 aperture 51P5 | 11.0% |
| P6 aperture 51P6 | 11.1% |
| P7 aperture 51P7 | 11.3% |
| P8 aperture 51P8 | 10.6% |
| P9 aperture 51P9 | 11.7% |

Example 3

Figure 39:
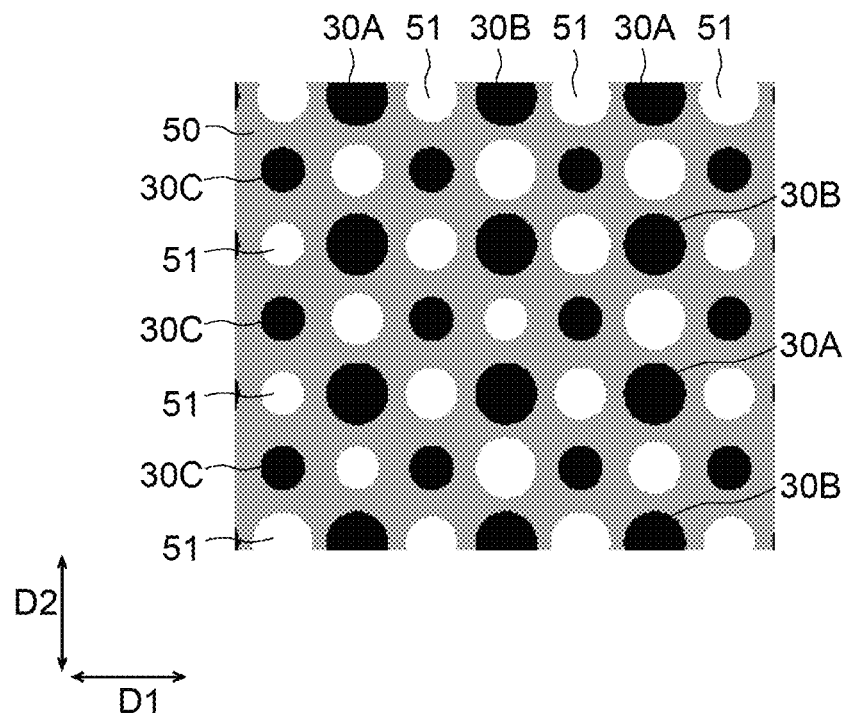
FIG. 39 is a plan view showing an example of an arrangement of apertures of a second electrode in Example 3.
Figure 40:
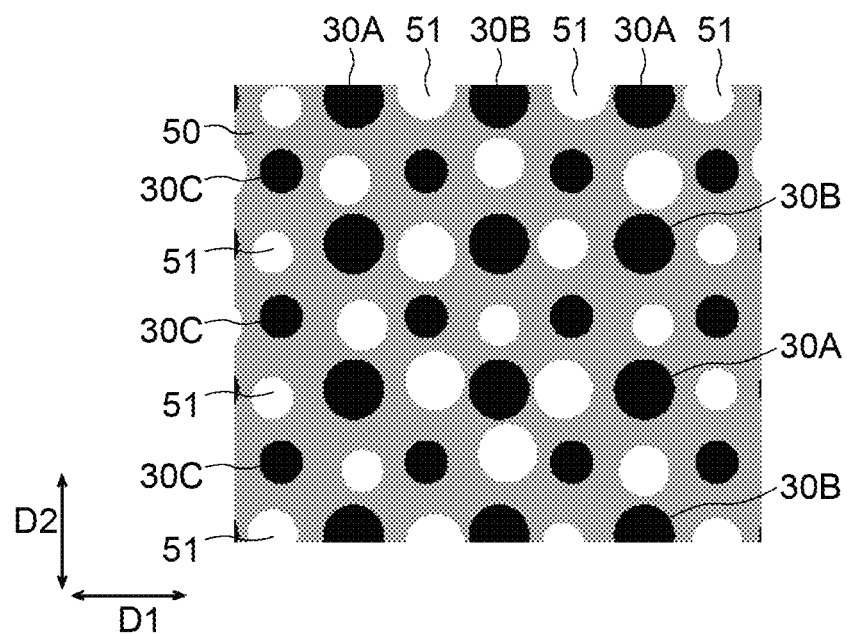
FIG. 40 is a plan view showing an example of an arrangement of apertures of a second electrode in Example 4.

An electronic device including first electrodes 30 and a second electrode 50 shown in FIG. 39 was designed in the same manner as in the case of Example 1 except that the plurality of apertures 51 includes the aforementioned S1 to S3 apertures 51S1 to 51S3. The diameter of each of the S1 apertures 51S1 is 28 µm. The diameter of each of the S2 apertures 51S2 is 33 µm. The diameter of each of the S3 apertures 51S3 is 23 µm. The threshold "TH3%" in Example 3 is for example 15%. The ratios of the S1 to S3 apertures 51S1 to 51S3 are shown in Table 2.

TABLE 2

| Type | Ratio |
| --- | --- |
| S1 aperture 51S1 | 32.4% |
| S2 aperture 51S2 | 34.2% |
| S3 aperture 51S3 | 33.4% |

Example 4

An electronic device including first electrodes 30 and a second electrode 50 shown in FIG. 39 was designed in the same manner as in the case of Example 1 except that the plurality of apertures 51 includes apertures 51 falling under the category of any of the aforementioned P1 to P9 apertures 51P1 to 51P9 and further falling under the category of the aforementioned S1 to S3 apertures 51S1 to 51S3. The amount of displacement Δ1 in the first direction D1 is 5 μm. The amount of displacement Δ2 in the second direction D2 is 5 μm. The diameter of each of the S1 apertures 51S1 is 28 μm. The diameter of each of the S2 apertures 51S2 is 33 μm. The diameter of each of the S3 apertures 51S3 is 23 μm. The ratios of the P1 to P9 apertures 51P1 to 51P9 and the ratios of the S1 to S3 apertures 51S1 to 51S3 are shown in Table 3.

TABLE 3

| Type | Ratio |
| --- | --- |
| P1 aperture 51P1 | 10.7% |
| P2 aperture 51P2 | 11.3% |
| P3 aperture 51P3 | 11.6% |
| P4 aperture 51P4 | 10.9% |
| P5 aperture 51P5 | 10.7% |
| P6 aperture 51P6 | 10.9% |
| P7 aperture 51P7 | 11.2% |
| P8 aperture 51P8 | 11.5% |
| P9 aperture 51P9 | 11.2% |
| S1 aperture 51S1 | 32.6% |
| S2 aperture 51S2 | 34.2% |
| S3 aperture 51S3 | 33.1% |

Figure 41:
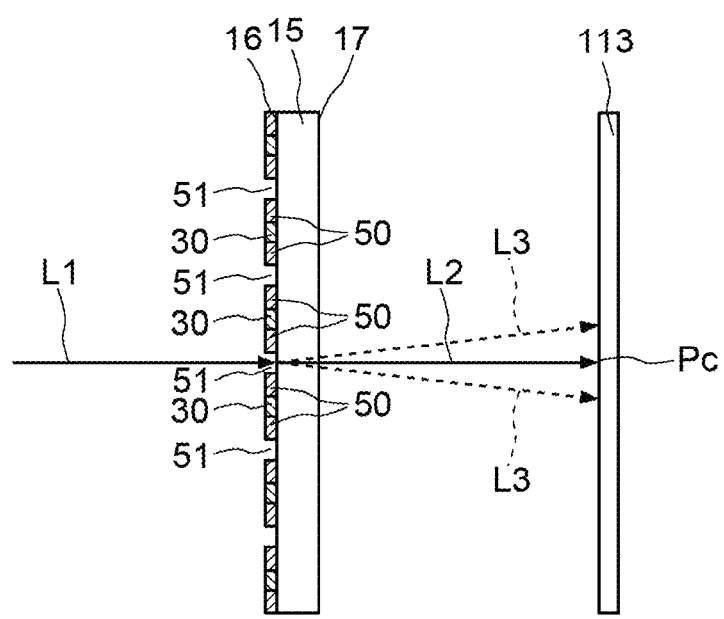
FIG. 41 is a diagram showing a method for evaluating diffraction.
Figure 42:
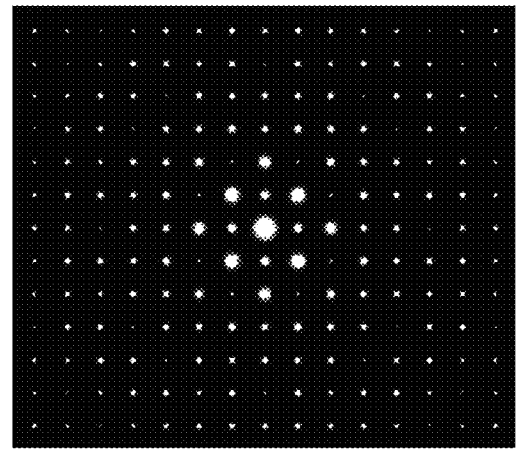
FIG. 42 is a diagram showing a result of evaluation of a pattern of projection in Example 1.
Figure 42:
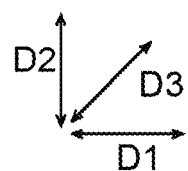

Regarding each of Examples 1 to 4, diffraction of light having passed through the second electrode 50 was verified by simulation. Specifically, as shown in FIG. 41, light L1 was made to fall on the substrate 15 along the direction normal to the first surface 16 of the substrate 15. Then, diffraction of light having passed through the apertures 51 and been transmitted through the second electrode 50 was calculated by simulation. Reference sign L2 denotes light that travels in a straight line without being diffracted and arrives at a screen 113. Reference sign Pc denotes a point of arrival of light L3 on the screen 113. Reference sign L3 denotes light diffracted when passing through the apertures 51. The distance between the second electrode 50 and the screen 113 is 5000 mm. The transmittance of the second electrode 50 was set to be 60%. The transmittance of each of the apertures 51 was set to be 100%. The transmittance of each of the first electrodes 30 was set to be 0%.

Figure 43:
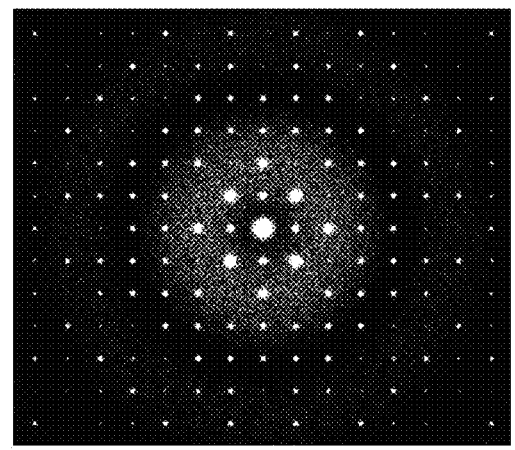
FIG. 43 is a diagram showing a result of evaluation of a pattern of projection in Example 2.
Figure 43:
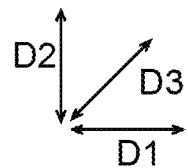
Figure 44:
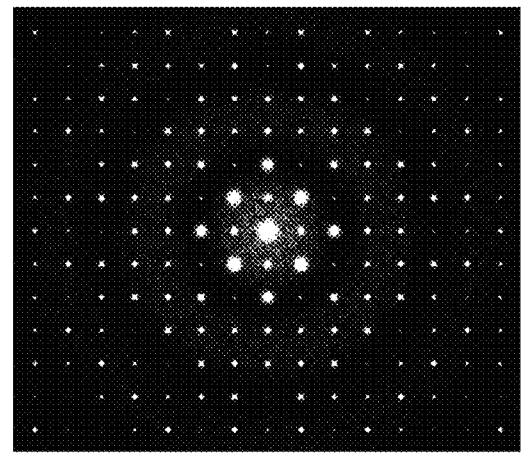
FIG. 44 is a diagram showing a result of evaluation of a pattern of projection in Example 3.
Figure 44:
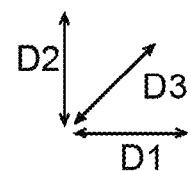
Figure 45:
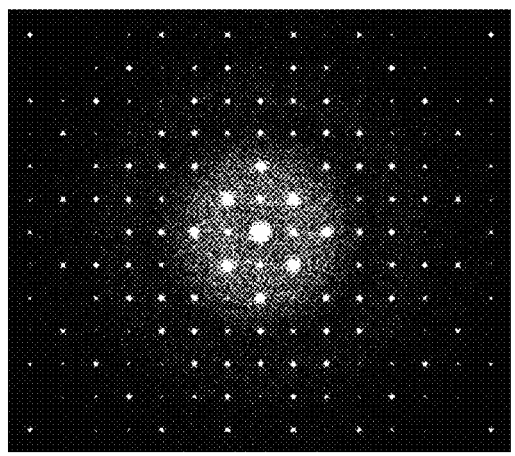
FIG. 45 is a diagram showing a result of evaluation of a pattern of projection in Example 4.
Figure 45:
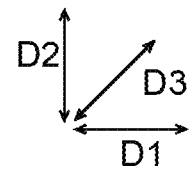

Patterns of projection of light arriving on the screen 113 in Examples 1 to 4 are shown in FIGS. 42 to 45, respectively. The patterns of projection of light in FIGS. 43 to 45 are more blurred than the pattern of projection of light in FIG. 42. This shows that Examples 2 to 4 are lower in intensity of diffracted light and higher in dispersion of diffracted light than Example 1. Accordingly, Examples 2 to 4 can restrain high-intensity diffracted light from falling on an optical component such as a sensor.

The pattern of projection of light in FIG. 43 is more blurred than the pattern of projection of light in FIG. 44. It can be said that adjusting the positions of the apertures 51 is more effective in dispersing diffracted light than adjusting the dimensions of the apertures 51.

Figure 46A:
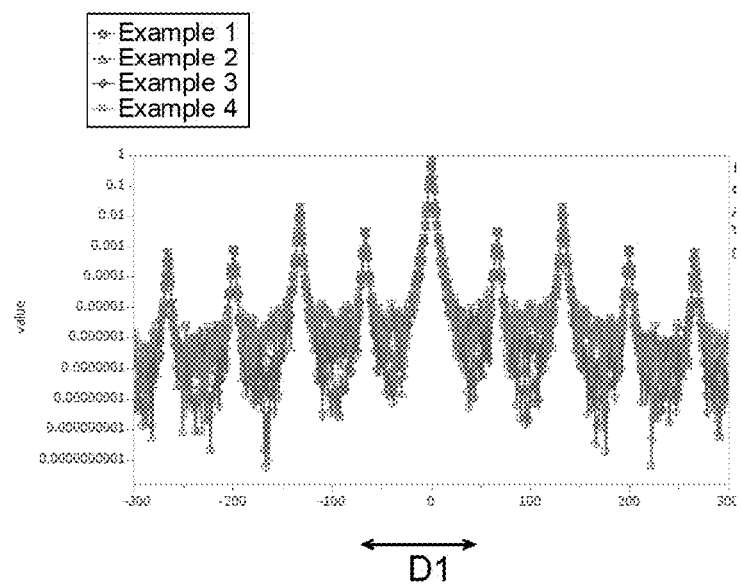
FIG. 46A is a diagram showing results of extracting the intensities of diffracted light in Examples 1 to 4 along a first direction.
Figure 46B:
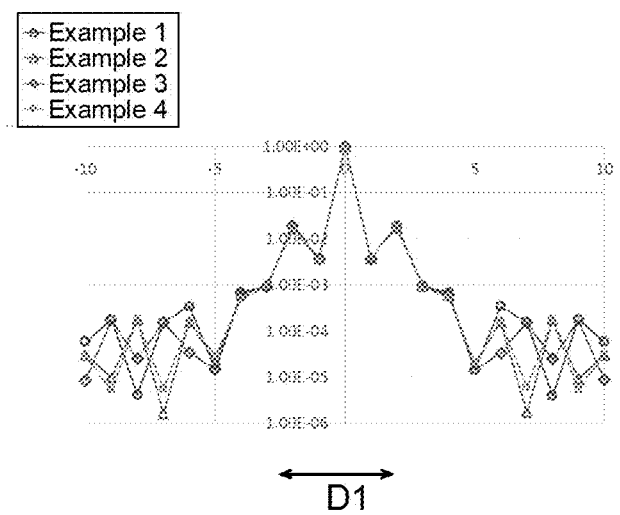
FIG. 46B is a diagram showing results of extracting the peak intensities of diffracted light of FIG. 46A.

FIG. 46A is a diagram showing results of extracting the intensities of diffracted light in Examples 1 to 4 along the first direction D1. The horizontal axis represents the distance from the point Pc in the first direction D1. The vertical axis represents the intensity of light having arrived at the screen 113. A peak located in the middle of the horizontal axis represents zeroth-order diffracted light. With distance from the peak of the zeroth-order diffracted light in the first direction D1, peaks of first-order diffracted light, peaks of second-order diffracted light, peaks of third-order diffracted light, and peaks of fourth-order diffracted light appear in sequence. FIG. 46B is a diagram showing results of extracting the respective peak intensities of peaks of zeroth-order to tenth-order diffracted light appearing in the first direction D1.

Figure 47A:
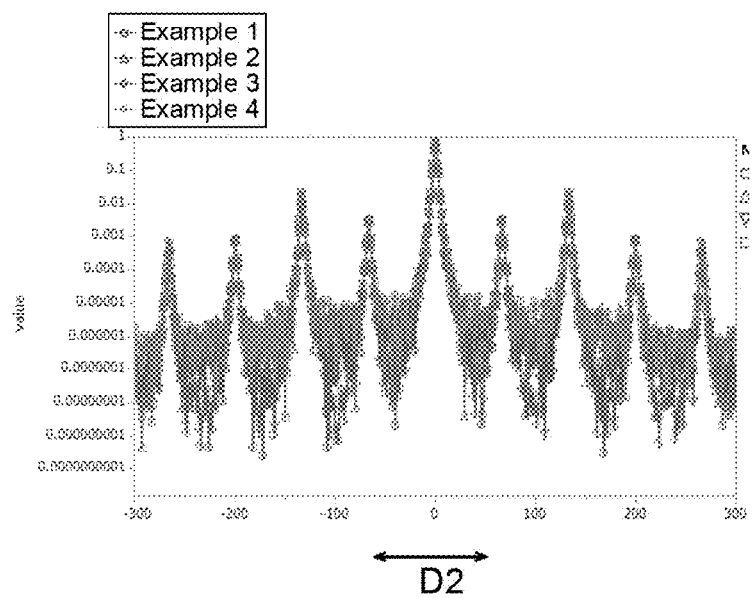
FIG. 47A is a diagram showing results of extracting the intensities of diffracted light in Examples 1 to 4 along a second direction.
Figure 47B:
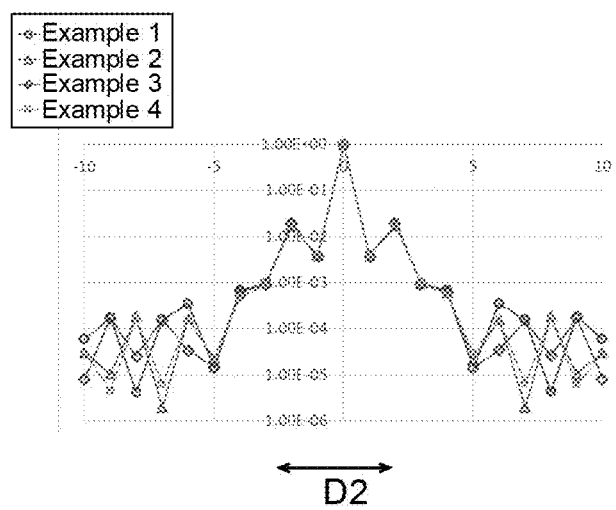
FIG. 47B is a diagram showing results of extracting the peak intensities of diffracted light of FIG. 47A.

FIG. 47A is a diagram showing results of extracting the intensities of diffracted light in Examples 1 to 4 along the second direction D2. The horizontal axis represents the distance from the point Pc in the second direction D2. The vertical axis represents the intensity of light having arrived at the screen 113. A peak located in the middle of the horizontal axis represents zeroth-order diffracted light. With distance from the peak of the zeroth-order diffracted light in the second direction D2, peaks of first-order diffracted light, peaks of second-order diffracted light, peaks of third-order diffracted light, and peaks of fourth-order diffracted light appear in sequence. FIG. 47B is a diagram showing results of extracting the respective peak intensities of peaks of zeroth-order to tenth-order diffracted light appearing in the second direction D2.

Figure 48A:
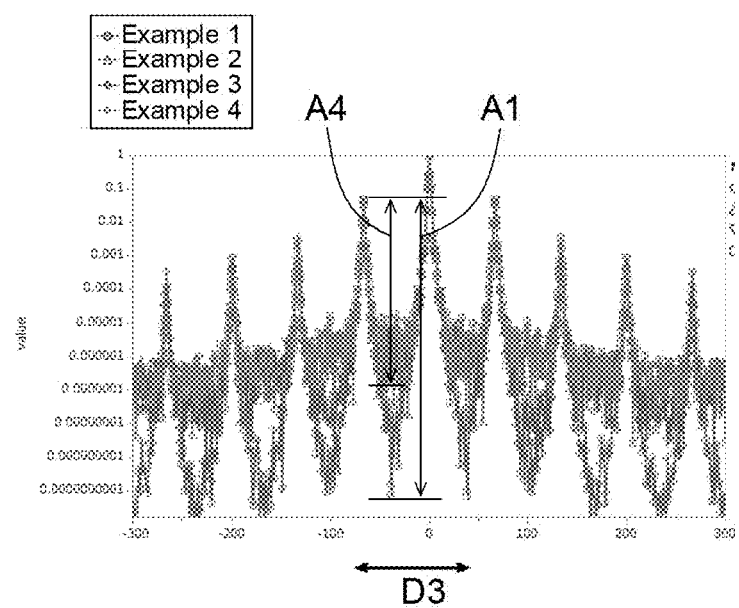
FIG. 48A is a diagram showing results of extracting the intensities of diffracted light in Examples 1 to 4 along a third direction.
Figure 48B:
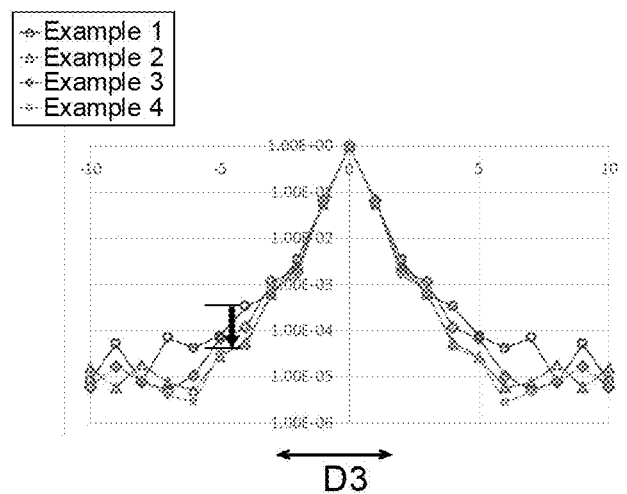
FIG. 48B is a diagram showing results of extracting the peak intensities of diffracted light of FIG. 48A.

FIG. 48A is a diagram showing results of extracting the intensities of diffracted light in Examples 1 to 4 along the third direction D3. The third direction D3 is a direction forming an angle of 45 degrees with respect to the first direction D1 and forming an angle of 45 degrees with respect to the second direction D2. The horizontal axis represents the distance from the point Pc in the third direction D3. The vertical axis represents the intensity of light having arrived at the screen 113. A peak located in the middle of the horizontal axis represents zeroth-order diffracted light. With distance from the peak of the zeroth-order diffracted light in the third direction D3, peaks of first-order diffracted light, peaks of second-order diffracted light, peaks of third-order diffracted light, and peaks of fourth-order diffracted light appear in sequence. FIG. 48B is a diagram showing results of extracting the respective peak intensities of peaks of zeroth-order to tenth-order diffracted light appearing in the third direction D3.

The heights of the peaks of diffracted light in Examples 2 to 4 are lower than the heights of the peaks of diffracted light in Example 1. For example, as shown in FIG. 48A, the height A4 of a peak of first-order diffracted light in Example 4 is lower than the height A1 of a peak of first-order diffracted light in Example 1.

The peak intensities diffracted light in Examples 2 to 4 are lower than the peak intensities of diffracted light in Example 1. For example, as indicated by a black arrow in FIG. 48B, the peak intensity of fourth-order diffracted light in Example 4 is lower than the peak intensity of fourth-order diffracted light in Example 1.

The invention claimed is:

1. An electronic device comprising:
   a substrate having a first surface and a second surface located opposite the first surface;
   a plurality of first electrodes located on the first surface of the substrate;
   a plurality of organic layers located on top of the first electrodes; and
   a second electrode located on top of the organic layers, the second electrode spreading so as to overlap the plurality of first electrodes in planar view,
   wherein
   each first electrode overlaps one of the plurality of organic layers,
   the second electrode includes a plurality of unit regions demarcated based on the plurality of first electrodes and a plurality of apertures located in the unit regions, the apertures not overlapping the first electrodes in planar view,
   each unit region is a polygon demarcated by lines of demarcation connecting center points of the first electrodes,
   each unit region includes a unit region center point located in a center of the unit region in planar view,
   each aperture includes an aperture center point located in a center of the aperture in planar view,
   the plurality of apertures includes a plurality of D11 apertures each displaced toward a D11 side with respect to the unit region center point and a plurality of D12 apertures each displaced toward a D12 side with respect to the unit region center point, and
   the D12 side is a side opposite to the D11 side in planar view.

2. The electronic device according to claim 1, wherein
   the plurality of apertures includes a plurality of D21 apertures each displaced toward a D21 side with respect to the unit region center point and a plurality of D22 apertures each displaced toward a D22 side with respect to the unit region center point,
   the D21 side is along a second direction orthogonal to a first direction along the D11 side and the D12 side, and
   the D22 is a side opposite to the D21 side in planar view.

3. The electronic device according to claim 2, wherein the plurality of apertures includes
   a plurality of P1 apertures falling under a category of the D11 apertures but not falling under a category of the D21 apertures or the D22 apertures,
   a plurality of P2 apertures falling under the category of the D11 apertures and falling under the category of the D21 apertures,
   a plurality of P3 apertures falling under the category of the D21 apertures but not falling under the category of the D11 apertures or the D12 apertures,
   a plurality of P4 apertures falling under the category of the D21 apertures and falling under the category of the D12 apertures,
   a plurality of P5 apertures falling under the category of the D12 apertures but not falling under the category of the D21 apertures or the D22 apertures,
   a plurality of P6 apertures falling under the category of the D12 apertures and falling under the category of the D22 apertures,
   a plurality of P7 apertures falling under the category of the D22 apertures but not falling under the category of the D11 apertures or the D12 apertures,
   a plurality of P8 apertures falling under the category of the D22 apertures and falling under the category of the D11 apertures, and
   a plurality of P9 apertures not falling under the category of the D11 apertures, the D12 apertures, the D21 apertures, or the D22 apertures.

4. The electronic device according to claim 3, wherein
   a ratio of a maximum P ratio to a minimum P ratio is lower than or equal to 3.00,
   the minimum P ratio is a number of apertures that are smallest in number of the P1 to P9 apertures, and
   the maximum P ratio is a number of apertures that are largest in number of the P1 to P9 apertures.

5. The electronic device according to claim 1, wherein
   the plurality of apertures includes a plurality of S1 apertures, a plurality of S2 apertures, and a plurality of S3 apertures,
   a dimension of each of the S2 apertures in planar view is larger than a dimension of each of the S1 apertures in planar view, and
   a dimension of each of the S3 apertures in planar view is smaller than the dimension of each of the S1 apertures in planar view.

6. The electronic device according to claim 5, wherein the plurality of apertures includes
   a plurality of D11S1 apertures falling under a category of the D11 apertures and falling under a category of the S1 apertures,
   a plurality of D11S2 apertures falling under the category of the D11 apertures and falling under a category of the S2 apertures,
   a plurality of D11S3 apertures falling under the category of the D11 apertures and falling under a category of the S3 apertures,
   a plurality of D12S1 apertures falling under a category of the D12 apertures and falling under the category of the S1 apertures,
   a plurality of D12S2 apertures falling under the category of the D12 apertures and falling under the category of the S2 apertures, and
   a plurality of D12S3 apertures falling under the category of the D12 apertures and falling under the category of the S3 apertures.

7. The electronic device according to claim 1, wherein each of the unit regions is demarcated by a quadrangle that is obtained by connecting center points of four of the first electrodes.

8. The electronic device according to claim 7, wherein
   the plurality of organic layers includes a plurality of first organic layers, a plurality of second organic layers, and a plurality of third organic layers,
   the plurality of first electrodes includes a plurality of A1 electrodes overlapping the first organic layers, a plurality of A2 electrodes overlapping the second organic layers, and a plurality of A3 electrodes overlapping the third organic layers, and
   the four of the first electrodes corresponding to the quadrangle include at least one of the A1 electrodes, at least one of the A2 electrodes, and at least one of the A3 electrodes.

9. The electronic device according to claim 8, wherein
   the first organic layers are red luminescent layers,
   the second organic layers are blue luminescent layers,
   the third organic layers are green luminescent layers, and
   the four of the first electrodes corresponding to the quadrangle include one of the A1 electrodes, one of the A2 electrodes, and two of the A3 electrodes.

10. The electronic device according to claim 1, wherein the apertures are surrounded by the second electrode in planar view.

11. The electronic device according to claim 1, wherein the organic layers include organic layer apertures overlapping the apertures in planar view.

12. The electronic device according to claim 11, wherein the organic layer apertures overlap parts of the second electrode in planar view.

13. The electronic device according to claim 1, further comprising an insulating layer including insulating layer first apertures overlapping the first electrodes in planar view, the insulating layer being located between the first surface of the substrate and the organic layers in a direction normal to the first surface.

14. The electronic device according to claim 13, wherein the insulating layer includes insulating layer second apertures located between the first electrodes in planar view, the insulating layer second apertures overlapping the apertures.

15. An electronic device comprising:
a substrate having a first surface and a second surface located opposite the first surface;
a plurality of first electrodes located on the first surface of the substrate;
a plurality of organic layers located on top of the first electrodes; and
a second electrode located on top of the organic layers, the second electrode spreading so as to overlap two or more of the first electrodes in planar view,
wherein
the second electrode includes a plurality of unit regions demarcated based on the plurality of first electrodes and a plurality of apertures located in the unit regions, the apertures not overlapping the first electrodes in planar view,
the plurality of apertures includes a plurality of S1 apertures, a plurality of S2 apertures, and a plurality of S3 apertures,
a dimension of each of the S2 apertures in planar view is larger than a dimension of each of the S1 apertures in planar view, and
a dimension of each of the S3 apertures in planar view is smaller than the dimension of each of the S1 apertures in planar view.

16. The electronic device according to claim 15, wherein
a ratio of a maximum S ratio to a minimum S ratio is lower than or equal to 10,
the minimum S ratio is a number of apertures that are smallest in number of the S1 to S3 apertures, and
the maximum S ratio is a number of apertures that are largest in number of the S1 to S3 apertures.

17. A manufacturing method for an electronic device, the manufacturing method comprising:
a preparing step of preparing a layered product including a substrate having a first surface and a second surface located opposite the first surface, a plurality of first electrodes located on the first surface of the substrate, and a plurality of organic layers located on top of the first electrodes; and
a second electrode forming step of forming a second electrode on top of the organic layers so that the second electrode overlaps the plurality of first electrodes in planar view,
wherein
each first electrode overlaps one of the plurality of organic layers,
the second electrode includes a plurality of unit regions demarcated based on the plurality of first electrodes and a plurality of apertures located in the unit regions, the apertures not overlapping the first electrodes in planar view,
each unit region is a polygon demarcated by lines of demarcation connecting center points of the first electrodes,
each unit region includes a unit region center point located in a center of the unit region in planar view,
each aperture includes an aperture center point located in a center of the aperture in planar view,
the plurality of apertures including a plurality of D11 apertures each displaced toward a D11 side with respect to the unit region center point and a plurality of D12 apertures each displaced toward a D12 side with respect to the unit region center point, and
the D12 side is a side opposite to the D11 side in planar view.

18. The manufacturing method according to claim 17, further comprising a removing step of removing parts of the unit regions and thereby forming the apertures.

19. The manufacturing method according to claim 18, wherein the removing step includes an irradiating step of irradiating the second electrode with a laser and thereby forming the apertures.

20. A manufacturing method for an electronic device, the manufacturing method comprising:
a preparing step of preparing a layered product including a substrate having a first surface and a second surface located opposite the first surface, a plurality of first electrodes located on the first surface of the substrate, and a plurality of organic layers located on top of the first electrodes; and
a second electrode forming step of forming a second electrode on top of the organic layers so that the second electrode overlaps the plurality of first electrodes in planar view,
wherein
the second electrode includes a plurality of unit regions demarcated based on the plurality of first electrodes and a plurality of apertures located in the unit regions, the apertures not overlapping the first electrodes in planar view,
the plurality of apertures includes a plurality of S1 apertures, a plurality of S2 apertures, and a plurality of S3 apertures,
a dimension of each of the S2 apertures in planar view is larger than a dimension of each of the S1 apertures in planar view, and
a dimension of each of the S3 apertures in planar view is smaller than the dimension of each of the S1 apertures in planar view.

* * * * *